(12) United States Patent
Hasimoto et al.

(10) Patent No.: US 11,062,899 B2
(45) Date of Patent: Jul. 13, 2021

(54) COATED FILM REMOVING APPARATUS

(71) Applicant: TOKYO ELECTRON LIMITED, Tokyo (JP)

(72) Inventors: Takafumi Hasimoto, Koshi (JP); Masahide Tadokoro, Koshi (JP); Taku Nagakane, Koshi (JP); Koji Takayanagi, Koshi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/876,283

(22) Filed: Jan. 22, 2018

(65) Prior Publication Data

US 2018/0211832 A1    Jul. 26, 2018

(30) Foreign Application Priority Data

Jan. 26, 2017   (JP) .............................. JP2017-012315
Oct. 13, 2017   (JP) .............................. JP2017-199613

(51) Int. Cl.
| | |
|---|---|
| *H01L 21/02* | (2006.01) |
| *H01L 21/67* | (2006.01) |
| *H01L 21/687* | (2006.01) |
| *B08B 3/08* | (2006.01) |
| *B08B 3/04* | (2006.01) |
| *G03F 7/40* | (2006.01) |
| *G03F 7/16* | (2006.01) |

(52) U.S. Cl.
CPC ........ *H01L 21/02087* (2013.01); *B08B 3/041* (2013.01); *B08B 3/08* (2013.01); *G03F 7/168* (2013.01); *G03F 7/40* (2013.01); *H01L 21/6708* (2013.01); *H01L 21/67051* (2013.01); *H01L 21/68764* (2013.01)

(58) Field of Classification Search
None
See application file for complete search history.

(56) References Cited

U.S. PATENT DOCUMENTS

| | | | | |
|---|---|---|---|---|
| 8,043,521 | B2 * | 10/2011 | Gale ................. | H01L 21/28167 216/95 |
| 8,361,234 | B2 * | 1/2013 | Izuta ................. | H01L 21/67051 118/715 |

(Continued)

FOREIGN PATENT DOCUMENTS

| | | |
|---|---|---|
| JP | 6-196401 A | 7/1994 |
| JP | 2012-99833 A | 5/2012 |

*Primary Examiner* — Sylvia MacArthur
(74) *Attorney, Agent, or Firm* — Nath, Goldberg & Meyer; Jerald L. Meyer; Tanya E. Harkins

(57) ABSTRACT

There is provided a coated film removing apparatus for removing, with a removal liquid, a peripheral portion of a coated film formed by supplying a coating liquid to a surface of a circular substrate, including: a rotary holding part configured to hold the substrate and rotate together with the substrate; a removal liquid nozzle configured to discharge the removal liquid on a peripheral portion of the surface of the substrate held by the rotary holding part so that the removal liquid is oriented toward a downstream side in a rotational direction of the substrate; and a control part configured to output a control signal so as to rotate the substrate at a rotation speed of 2,300 rpm or more when discharging the removal liquid.

8 Claims, 19 Drawing Sheets

(56) References Cited

U.S. PATENT DOCUMENTS

| | | | |
|---|---|---|---|
| 2010/0032097 A1* | 2/2010 | Ohashi | H01L 21/67034 156/345.55 |
| 2010/0200163 A1* | 8/2010 | Puggi | H01L 21/67051 156/345.21 |
| 2013/0156948 A1* | 6/2013 | Amano | H01L 21/67051 427/240 |
| 2013/0284368 A1* | 10/2013 | Hashizume | H01L 21/02063 156/345.21 |
| 2014/0326281 A1* | 11/2014 | Nakamura | H01L 21/67028 134/95.1 |
| 2015/0093905 A1* | 4/2015 | Fujiwara | H01L 21/67028 438/745 |
| 2018/0211832 A1* | 7/2018 | Hasimoto | G03F 7/168 |

* cited by examiner

First rotation speed

First rotation speed

Second rotation speed

First rotation speed

First rotation speed

First rotation speed

Concave wafer (warp amount 150μm)

COATED FILM REMOVING APPARATUS

CROSS-REFERENCE TO RELATED APPLICATIONS

This application is based upon and claims the benefit of priority from Japanese Patent Application Nos. 2017-012315 and 2017-199613, filed on Jan. 26, 2017, and Oct. 13, 2017, respectively, the entire contents of which are incorporated herein by reference.

TECHNICAL FIELD

The present disclosure relates to a coated film removing apparatus for removing a peripheral portion of a coated film formed on a surface of a circular substrate with a removal liquid, a coated film removing method and a non-transitory computer-readable storage medium.

BACKGROUND

A peripheral portion coated film removal (Edge Bead Removal: EBR) processes is performed to remove unnecessary film in a photolithography process for forming a coated film pattern on a semiconductor wafer (hereinafter referred to as a wafer) which is a substrate. Removal of unnecessary film in a peripheral portion of a coated film in a ring shape is performed by supplying a solvent to a wafer on which a coated film is formed. In addition, a coated film solvent is locally discharged from a solvent nozzle to a peripheral portion of a wafer mounted on and rotated by a spin chuck.

In the above-described EBR process, when removing a film in a peripheral portion of a coated film, in order to secure a formation region of a circuit pattern and to improve the yield of a semiconductor device, the occurrence of bumps should be prevented or minimized in the boundary of the coated film edge portion in the vicinity of the film removal region. The requirement for defects in the EBR process is expected to become strict as the number of photolithography steps increases along with miniaturization of the circuit. Thus, development a technique for suppressing the occurrence of bumps is expected.

For example, there is known a technique in which a solvent is discharged from a solvent nozzle to dissolve a thin film existing in an edge portion of a substrate and a gas is discharged from a gas nozzle to a location at which the solvent has been discharged, whereby the solvent is removed by blowing away the solvent outward of the edge portion of the substrate. In this example, the gas is discharged to the solvent from the obliquely rear upper side by the gas nozzle. Therefore, if this technique is applied to the EBR process, the solvent on the coated film is scattered and the coated film on the portion other than the peripheral portion of the wafer is also removed. As a result, there is a concern that the shape of the edge portion of the coated film deteriorates.

There is also known a technique in which, when supplying a processing liquid to a peripheral portion of a substrate from a processing liquid supplying part, a gas ejecting part is installed more inward of the peripheral portion of the substrate than the processing liquid supplying part to correct warping of the substrate. If this technique is applied to the EBR process, the improvement of the shape of the coated film edge portion in the vicinity of a solvent supply region cannot be expected because the gas is ejected from a position closer to an outer periphery of the wafer than the solvent on the coated film.

SUMMARY

Some embodiments of the present disclosure provide a technique capable of, when a peripheral portion of a coated film formed on a surface of a circular substrate is removed by a removal liquid, suppressing the occurrence of a bulge in a coated film edge portion in the vicinity of a boundary with a coated film removal region.

According to one embodiment of the present disclosure, there is provided a coated film removing apparatus for removing, with a removal liquid, a peripheral portion of a coated film formed by supplying a coating liquid to a surface of a circular substrate, including: a rotary holding part configured to hold the substrate and rotate together with the substrate; a removal liquid nozzle configured to discharge the removal liquid on a peripheral portion of the surface of the substrate held by the rotary holding part so that the removal liquid is oriented toward a downstream side in a rotational direction of the substrate; and a control part configured to output a control signal so as to rotate the substrate at a rotation speed of 2,300 rpm or more when discharging the removal liquid.

According to another embodiment of the present disclosure, there is provided a coated film removing method for removing, with a removal liquid, a peripheral portion of a coated film formed by supplying a coating liquid to a surface of a circular substrate, including: horizontally holding the substrate in a holding part; and subsequently, discharging the removal liquid from a removal liquid nozzle onto a peripheral portion of the surface of the substrate in a state in which the substrate is rotated at a rotation speed of 2,300 rpm or more, so that the removal liquid is oriented toward a downstream side in a rotational direction of the substrate.

According to another embodiment of the present disclosure, there is provided a non-transitory computer-readable storage medium storing a computer program used for a coated film removing apparatus for removing, with a removal liquid, a peripheral portion of a coated film formed by supplying a coating liquid to a surface of a circular substrate, wherein the computer program includes step groups incorporated so as to execute the aforementioned coated film removing method.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a coating apparatus 1 to which a coated film removing apparatus of the present disclosure is applied will be described with reference to a vertical sectional side view of FIG. 1 and a plan view of FIG. 2. The coating apparatus 1 is configured to perform a process of coating a coating liquid on a wafer W used as a substrate to form a coated film and an EBR process. The wafer W has a circular shape and the diameter thereof is, for example, 300 mm. A notch N as a cutout indicating the orientation of the wafer W is formed in a peripheral portion of the wafer W.

Figure 1:
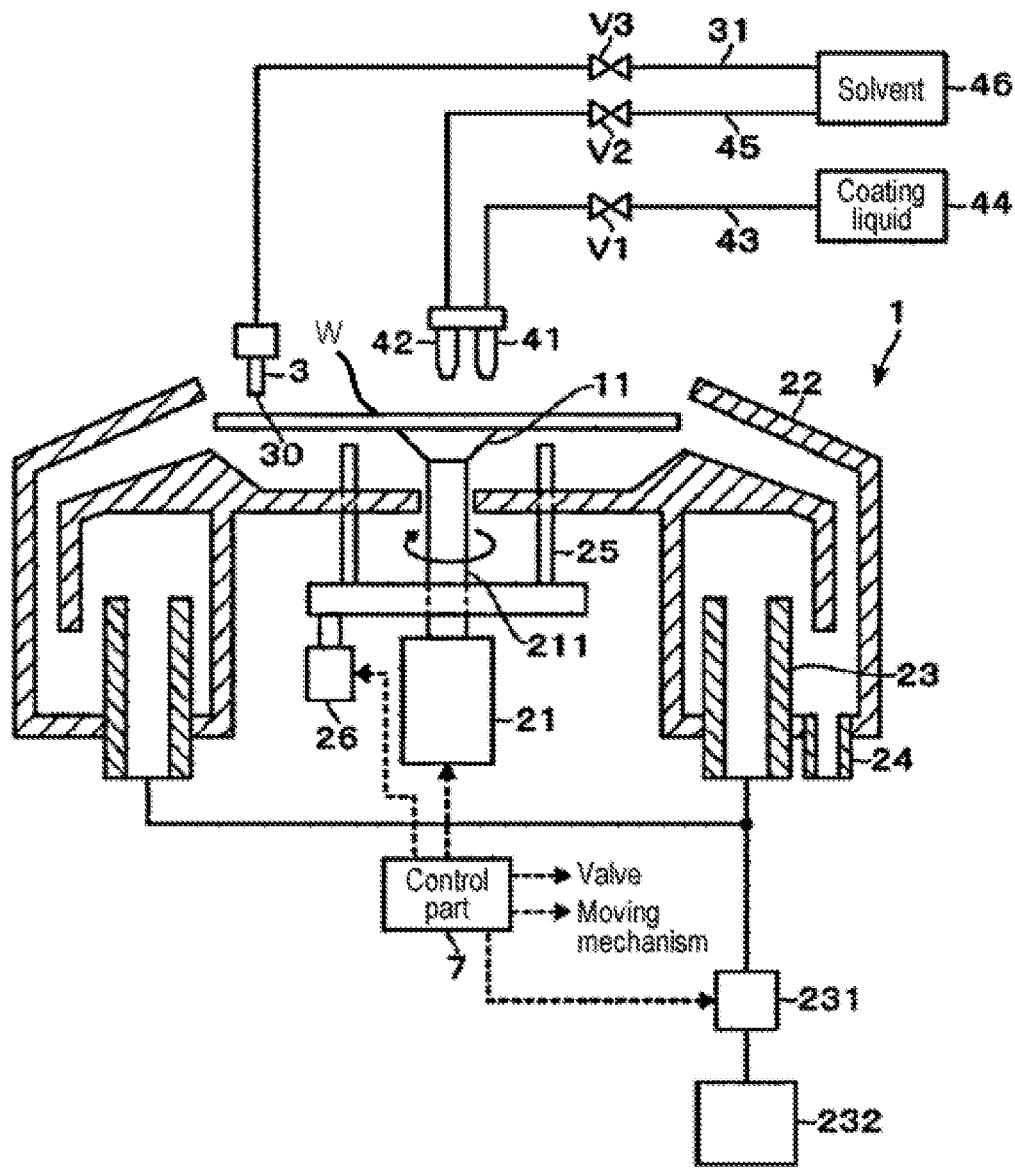
FIG. 1 is a vertical sectional side view showing an embodiment of a coating apparatus to which a coated film removing apparatus is applied.
Figure 2:
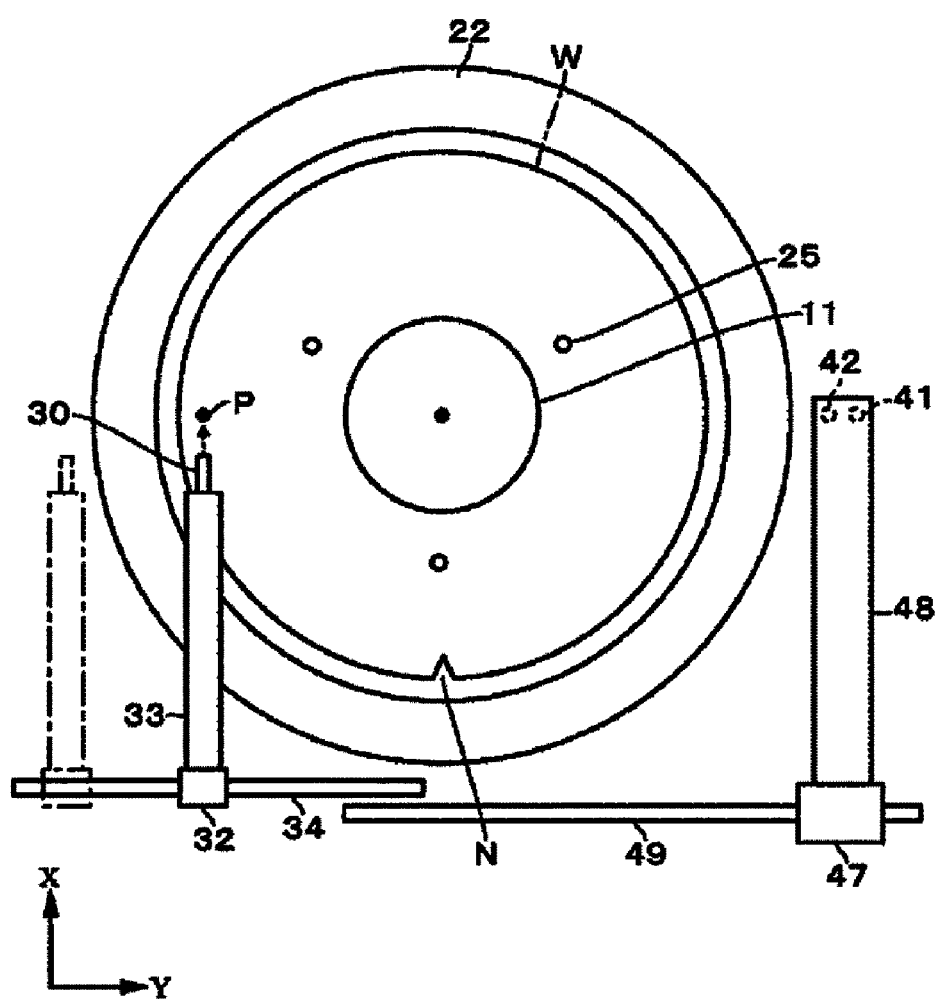
FIG. 2 is a plan view showing a coating apparatus.

In FIGS. 1 and 2, reference numeral 11 denotes a spin chuck serving as a rotary holding part for holding and rotating the wafer W. The spin chuck 11 is configured to attract and horizontally hold the central portion of a rear surface of the wafer W and is rotatable in a clockwise direction from a plan view about a vertical axis by a rotation mechanism 21. The spin chuck 11 and the rotation mechanism 21 are connected to each other by a shaft 211. A cup 22 is provided around the wafer W held by the spin chuck 11. The cup 22 is exhausted through an exhaust pipe 23. Liquid draining into the cup 22 from the wafer W is removed by a drain pipe 24.

The exhaust pipe 23 is connected to an exhaust mechanism 232, which is, for example, an in-plant exhaust passage, via an exhaust amount adjusting part 231 formed of, for example, a damper, so that an internal pressure of the cup 22 can be adjusted. In FIGS. 1 and 2, reference numeral 25 denotes lift pins which are configured to be moved up and down by a lifting mechanism 26 so as to transfer the wafer W between a transfer mechanism (not shown) for the wafer W and the spin chuck 11.

The coating apparatus 1 includes a coating liquid nozzle 41 configured to discharge a coating liquid vertically downward and a solvent nozzle 42 configured to discharge a solvent, which is a solvent of the coating liquid, vertically downward. The coating liquid nozzle 41 is connected to a coating liquid supply mechanism 44 that supplies a coating liquid to the coating liquid nozzle 41 via a flow path 43 in which an opening/closing valve V1 is installed. The solvent nozzle 42 is a nozzle used for a pretreatment performed before discharging the coating liquid to the wafer W. The solvent nozzle 42 is connected to a solvent supply mechanism 46 that supplies a solvent to the solvent nozzle 42 via a flow path 45 in which an opening/closing valve V2 is installed. As shown in FIG. 2, the coating liquid nozzle 41 and the solvent nozzle 42 are supported by an arm 48 configured to be moved in vertical and horizontal directions by a moving mechanism 47. The coating liquid nozzle 41 and the solvent nozzle 42 are configured to be movable between above the central portion of the wafer W and a retraction position defined outside the cup 22. Reference numeral 49 in FIG. 2 denotes a guide for allowing the moving mechanism 47 to move in the horizontal direction as described above.

The coating apparatus 1 further includes a removal liquid nozzle 3 used for performing the above-described EBR process. The removal liquid nozzle 3 is configured to discharge a removal liquid on the peripheral portion of the surface of the wafer W held by the spin chuck 11 so that the removal liquid is directed to the downstream side in the rotational direction of the wafer W. The removal liquid nozzle 3 is formed, for example, in a straight pipe shape, and the tip thereof is opened as a discharge port 30 of the removal liquid.

The removal liquid of this example is a solvent which is a solvent of the coating liquid. The removal liquid nozzle 3 is connected to the solvent supply mechanism 46 via a flow path 31 in which an opening/closing valve V3 is installed. A solvent (removal liquid) is supplied from the common solvent supply mechanism 46 to the solvent nozzle 42 and the removal liquid nozzle 3 independently of each other. As shown in FIG. 2, the removal liquid nozzle 3 is supported by an arm 33 configured to be moved in vertical and horizontal directions by a moving mechanism 32. The removal liquid nozzle 3 is configured to be movable between a process position where the removal liquid is discharged to the peripheral portion of the wafer and a retraction position defined outside the cup 22. In FIG. 2, the movement direction of the removal liquid nozzle 3 is indicated as a Y direction, and the horizontal direction orthogonal to the Y direction is indicated as an X direction. Reference numeral 34 in FIG. 2 denotes a guide for allowing the moving mechanism 32 to move in the horizontal direction as described above.

Figure 3:
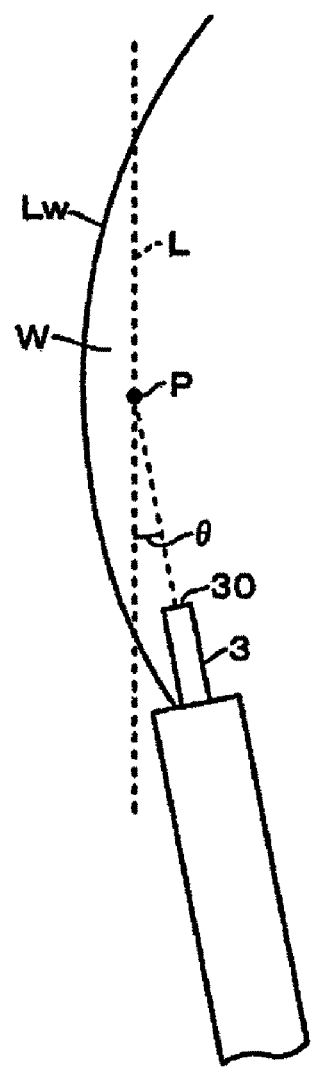
FIG. 3 is a plan view showing a removal liquid nozzle provided in the coating apparatus.

As shown in FIG. 3, when viewed in a horizontal plane, the removal liquid nozzle 3 is arranged such that an angle θ formed by a straight line connecting the discharge port 30 of the removal liquid nozzle 3 and a supply position P and a tangent line tangential to the wafer W at the supply position P is set to, for example, 0 degrees. The angle θ may be relatively small from the viewpoint of preventing liquid from splashing. That is to say, the tangent line L at the supply position P and the discharge direction of the removal liquid may be substantially parallel to each other. Specifically, the angle θ may be 6 degrees or less. The supply position P of the removal liquid refers to the landing position when the removal liquid discharged from the removal liquid nozzle 3 reaches the surface of the wafer W. In FIG. 3, a portion of the outer edge Lw of the wafer W is indicated by a solid line, and the tangent line L of the wafer W at the supply position P and the discharge direction of the removal liquid are indicated by dotted lines.

Figure 4:
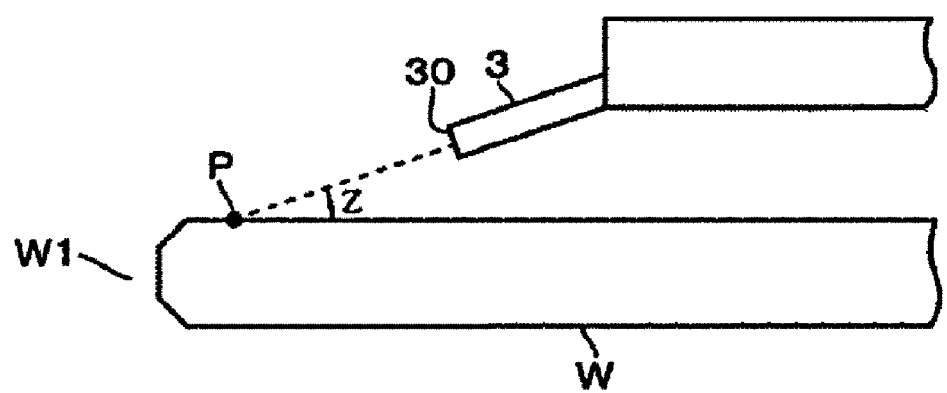
FIG. 4 is a vertical sectional side view showing the removal liquid nozzle.

Further, as shown in FIG. 4, when viewed in a vertical plane, the removal liquid nozzle 3 is arranged such that an angle Z formed by a straight line connecting the removal liquid nozzle 3 and the supply position P and the surface of the wafer W is set to, for example, 10 degrees. The angle Z may be relatively small from the viewpoint of preventing liquid from splashing. Specifically, the angle Z may be 20 degrees or less, especially 15 degrees or less. In addition, a diameter A of the discharge port 30 of the removal liquid nozzle 3 is set to, for example, 0.15 to 0.35 mm, specifically 0.15 to 0.25 mm.

The coating apparatus 1 further includes a control part 7. The control part 7 is formed of, for example, a computer, and includes a program storage part (not shown). In the program storage part, a program is stored in which commands (step groups) are incorporated so as to be able to perform a coated film forming process and an EBR process, which will be described later. Thus, a control signal is outputted from the control part 7 to each part of the coating apparatus 1 according to the program, whereby the operation of each part of the coating apparatus 1 is controlled. Specifically, the respective operations such as the opening/closing control of the opening/closing valves V1 to V3, the movement of the removal liquid nozzle 3, the coating liquid nozzle 41 and the solvent nozzle 42 performed by the moving mechanisms 32 and 47, the rotation of the spin chuck 11 performed by the rotation mechanism 21, the adjustment of the internal pressure of the cup 22 performed by the exhaust amount adjusting part 231, the lifting of the lift pins 25 performed by the lifting mechanism 26, and the like are controlled. The program is stored in the program storage part while being stored in a storage medium such as a hard disk, a compact disk, a magneto-optical disk, a memory card, or the like.

Further, the control part 7 of this example is configured to output a control signal for executing a first step and a second step in the EBR process. The first step refers to a step in which, in a state in which the wafer W is rotated at a first rotation speed of 2,300 rpm or more, a removal liquid is discharged from the removal liquid nozzle 3 while moving the supply position P of the removal liquid from the peripheral edge position of the surface of the wafer W to a coated film cutting position closer to the central portion of the wafer W than the peripheral edge position. A beveled portion W1 is provided on the peripheral edge of the wafer W. In this example, the peripheral edge position is a flat surface portion located inward of the beveled portion W1 and is a position shifted inward by 0.1 to 0.3 mm from an edge of the flat surface portion (the boundary with the beveled portion). The second step refers to a step in which the removal liquid nozzle 3 is moved away from the cutting position to the peripheral edge side of the wafer W within 1 second, specifically within 0.5 seconds, after the supply position P reaches the cutting position.

Further, the control part 7 is configured to output a control signal for executing a step in which, after the second step, the supply position P is set to lie between the cutting position and the peripheral edge position, or to lie at the peripheral edge position, and the removal liquid is discharged from the removal liquid nozzle 3 while rotating the wafer W at a second rotation speed lower than the first rotation speed. In the second position, the second rotation speed is set to, for example, 500 to 2,000 rpm.

Subsequently, the coated film forming process (coated film forming step) and the EBR process (EBR step) performed by the coating apparatus 1 will be described. First, the wafer W is transferred to and mounted on the spin chuck 11 by a transfer mechanism (not shown). Then, the interior of the cup 22 is exhausted at an exhaust pressure of, for example, 65 Pa and subsequently, the solvent is discharged from the solvent nozzle 42 onto the central portion of the wafer W. The rotation of the wafer W is started, and the solvent is coated on the entire surface of the wafer W by virtue of a centrifugal force to improve the wettability of the surface of the wafer W with respect to the coating liquid. Thereafter, in a state in which the wafer W is rotated, a coating liquid (in this example, a resist liquid) is discharged from the coating liquid nozzle 41 onto the central portion of the wafer W. The coating liquid is coated on the entire surface of the wafer W by virtue of a centrifugal force. Thereafter, a liquid film is dried by rotating the wafer W for a predetermined period of time to form a coated film 10.

Figure 5A:
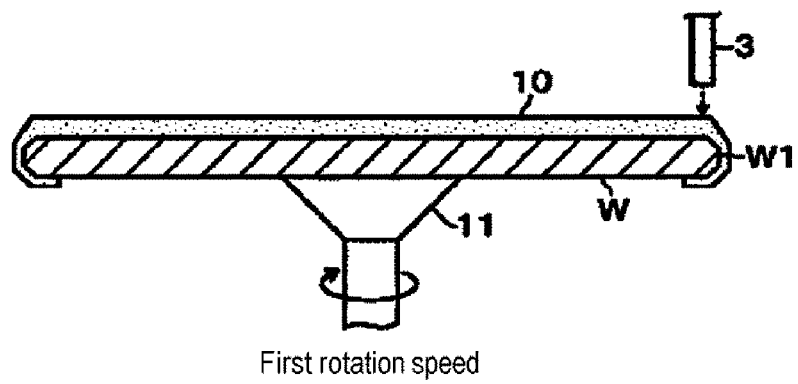
FIGS. 5A to 5D are vertical sectional side views showing the operation of the coating apparatus.
Figure 5B:
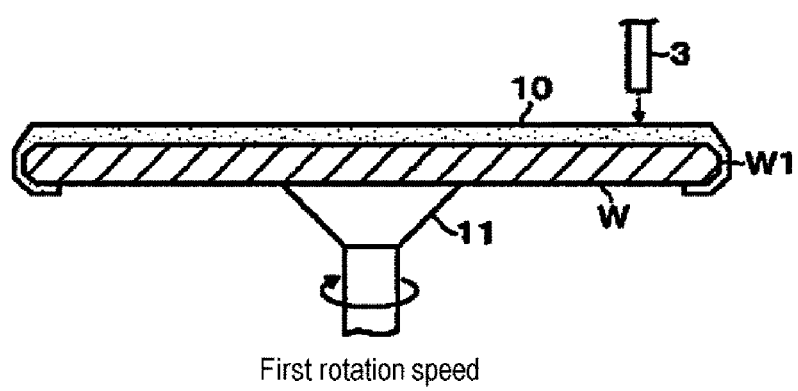

Subsequently, the EBR step is executed. In this process, for example, an exhaust amount in the cup 22 is made larger than that in the coated film forming step, and the exhaust pressure is set to 50 Pa or more, for example, 75 Pa. Then, as shown in FIG. 5A, the removal liquid nozzle 3 is moved from the retraction position defined outside the wafer W so that the supply position P of the removal liquid lies at the peripheral edge position, and the first step is executed. In a state in which the wafer W is rotated at the first rotation speed of 2,300 rpm or more, the removal liquid is discharged from the removal liquid nozzle 3 at a flow rate of, for example, 20 to 60 ml/min, specifically 55 ml/min or more while moving the supply position P of the removal liquid from the peripheral edge position to the first position which is the cutting position (FIG. 5B). The first position (cutting position) in this example is, for example, a position shifted by 2 mm from the outer edge of the wafer W toward the central portion of the wafer W. In the figures, the ratio of dimensions is not necessarily accurate in order to facilitate a clear understanding of the technique.

In the first step, it is necessary to rotate the wafer W at a rotation speed of 2,300 rpm or more in order to prevent the occurrence of bump (bulge) at the end portion of the coated film. In some embodiments, the rotation speed may be 2,500 rpm or more, specifically 3,000 rpm or more. More specifically, the rotation speed may be set to 4,000 rpm. The upper limit of the rotation speed of the wafer W in the first step is, for example, 5,000 rpm.

Subsequently, the second step is executed. In other words, immediately after the supply position P of the removal liquid has reached the cutting position, the removal liquid nozzle 3 is moved from the first position to the peripheral edge side of the wafer W, for example, without having to wait for a standby time. The phrase "without having to wait for a standby time" means that, for example, even when the standby time is not included in the movement recipe of the removal liquid nozzle 3, the removal liquid nozzle 3 is stopped at the cutting position for, for example, about 0.1 to 0.5 second (in this example, 0.1 second) due to the operation of a driving mechanism. It is necessary to immediately move the removal liquid nozzle 3 to the peripheral edge side after the supply position of the removal liquid reaches the first position. The term "immediately" is, for example, 1 second or less. Therefore, for example, this step is a step in which the removal liquid nozzle 3 is moved toward the peripheral edge side of the wafer W without substantially stopping after the supply position P of the removal liquid reaches the cutting position.

The removal liquid is discharged from the removal liquid nozzle 3 toward the downstream side in the rotational direction of the wafer W so that the extension line of the discharge trace of the removal liquid is directed to the outside of the peripheral portion of the coated film. Since the wafer W is rotating at a high rotation speed of 2,300 rpm or more, a large centrifugal force is generated and the removal liquid flows quickly so as to be pushed out outward of the wafer W. As a result, in the supply region of the removal liquid, the coated film 10 is softened and dissolved by the removal liquid. The removal liquid containing the components of the dissolved coated film is pushed outward of the wafer W and removed by a large centrifugal force.

Figure 5C:
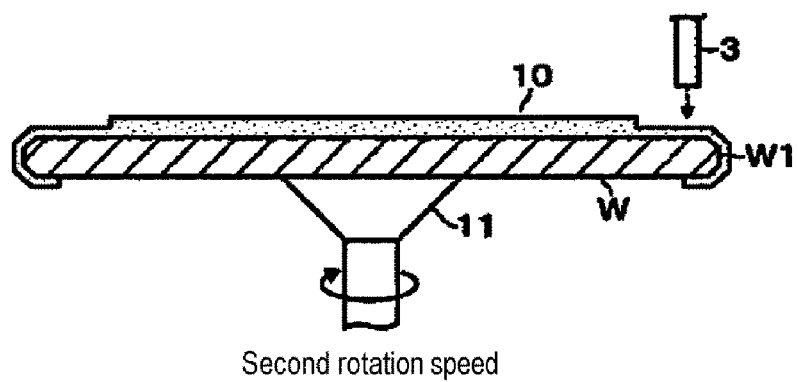

Thus, after the second step is executed, a step of cleaning the beveled portion W1 of the end face of the wafer is executed. This step is a step in which the supply position P of the removal liquid is set between the first position and the peripheral edge position or at the peripheral edge position, and the removal liquid is discharged from the removal liquid nozzle 3 while rotating the wafer W at a second rotation speed of 500 rpm to 2,000 rpm, for example, 1,000 rpm (FIG. 5C). For example, as shown in FIG. 5C, the supply position of the removal liquid (second position) in this step is a position shifted by 0.5 mm inward of the wafer W from the outer edge of the wafer W. In this step, the removal liquid is continuously supplied to the second position for, for example, 1 second or more (in this example, 5 seconds).

The second rotation speed when discharging the removal liquid to the second position is lower than the first rotation speed when discharging the removal liquid to the first position. Therefore, the removal liquid is pushed out outward of the wafer W by virtue of a centrifugal force at a speed lower than the speed when the removal liquid is discharged to the first position. The removal liquid flows so as to go around the outer edge of the wafer W toward the rear surface side while suppressing a splash phenomenon that the removal liquid discharged to the wafer W is repelled from the rotating wafer W. In this way, at the beveled portion W1 of the end face of the wafer W, the removal liquid also spreads to the rear surface side, whereby the components adhering to the beveled portion W1 are cleaned by the removal liquid.

Figure 5D:
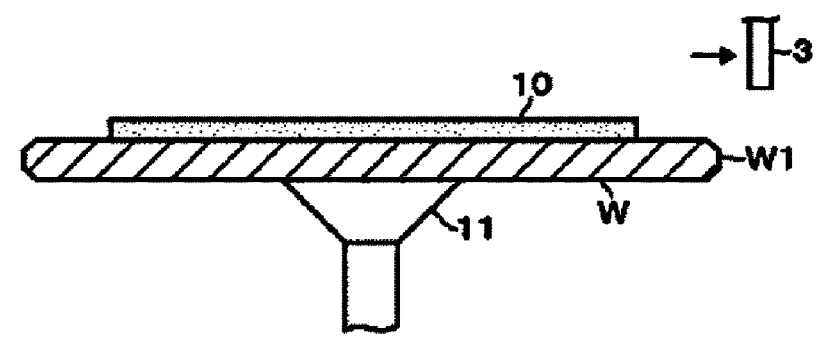

After removing the unnecessary peripheral portion of the coated film and cleaning the beveled portion W1 in this manner, for example, the exhaust amount is returned to the exhaust amount at the time of forming the coated film, and the discharging of the removal liquid from the removal liquid nozzle 3 is stopped. The removal liquid nozzle 3 is moved to the standby position (FIG. 5D). Then, the rotation of the wafer W is stopped, and the wafer W is unloaded from the coating apparatus 1 by a transfer mechanism (not shown).

According to the above embodiment, when supplying the removal liquid to the peripheral portion of the coated film on the wafer surface to remove the unnecessary coated film of the peripheral portion, the wafer W is rotated at the rotation speed of 2,300 rpm or more at the time of discharging the removal liquid. Therefore, a large centrifugal force is generated, and the removal liquid flows so as to be pushed out outward of the wafer W. As a result, the removal liquid existing at the cutting position is restrained from infiltrating into the end portion of the coated film, and the generation of a force to lift up the end portion of the coated film is suppressed. Thus, the unnecessary peripheral portion of the coated film is removed in a state in which the occurrence of a bump (bulge) at the end portion of the coated film is suppressed. In addition, as is apparent from evaluation tests described later, the height of the bump generated by the EBR process is reduced irrespective of the type of removal liquid.

Further, since the removal liquid nozzle 3 is moved from the cutting position to the peripheral edge side immediately, for example, within 1 second, after the supply position P of the removal liquid reaches the cutting position, the removal liquid supplied to the cutting position is caused to rapidly flow from the cutting position toward the peripheral edge side of the wafer W by a large centrifugal force. Therefore, the infiltration of the removal liquid into the end portion of the coated film at the cutting position is suppressed, whereby the formation of the bump is further suppressed. By moving the removal liquid nozzle 3 from the cutting position to the peripheral edge side within 1 second after the supply position P of the removal liquid reaches the cutting position, a period of time required for the EBR process is shortened, which contributes to the improvement of the throughput.

Furthermore, if the rotation speed of the wafer W during the EBR step is high, there is a possibility that the cleaning of the beveled portion W1 is insufficient. However, by executing the cleaning step of discharging the removal liquid at the position outside the cutting position of the coated film, it is possible to increase the degree of cleanliness at the beveled portion W1. In the cleaning step, the second rotation speed is lower than the first rotation speed, and the supply time of the removal liquid at the second position is long. However, since the second position is closer to the peripheral edge side of the wafer W than the first position, the infiltration of the removal liquid into the end portion of the coated film is suppressed. As described above, in the cleaning step, the magnitude of the second rotation speed, the second position, and the stop time when the supply position is set to the second position, are determined so that the beveled portion W1 can be sufficiently cleaned while suppressing the occurrence of the bump.

On the other hand, it is recognized that if the rotation speed of the wafer W at the time of supplying the removal liquid is increased, a liquid splash phenomenon occurs, whereby the mist of the removal liquid scattered by the liquid splash re-adheres to the wafer W to become mist-like defects (wet particles) so that the number of defects in the peripheral portion of the wafer W increases. Therefore, in the above-described embodiment, by optimizing the angle of the removal liquid nozzle 3, the occurrence of the liquid splash phenomenon is mitigated. As a result, the number of defects is reduced. That is to say, in the removal liquid nozzle 3 of the present embodiment, the aforementioned angle $\theta$ is set to 6 degrees or less and the aforementioned angle Z is set to 20 degrees or less. Thus, the removal liquid is discharged substantially in the rotational direction from the removal liquid nozzle 3 which is inclined slightly upward from the horizontal surface with respect to the surface of the wafer W. Therefore, when the removal liquid is supplied to the wafer W rotating at a high speed, the impact force when the removal liquid collides against the surface of the wafer W becomes small, and the removal liquid becomes easy to fit on the wafer W, whereby the liquid splash is prevented. Since the liquid splash is prevented, the adhesion of the wet particles to the peripheral portion of the wafer is also reduced.

Further, in the EBR step, by setting the inside of the cup 22 to a high exhaust state of, for example, 50 Pa or more, it is possible to reduce the adhesion of wet particles. This is because the removal liquid splashed in a mist shape is quickly discharged from the exhaust path.

Furthermore, it is recognized that if the rotation speed of the wafer W at the time of supplying the removal liquid is increased, the cutting accuracy of the cut surface of the coated film (the end surface of the coated film at the cutting position) is lowered, the cut surface is roughened in a plan view, and the smoothness is reduced. Therefore, in the present embodiment, the diameter A of the discharge port 30 of the removal liquid nozzle 3 is set to be small, i.e., 0.15 to 0.35 mm. As a result, the discharge pressure of the removal liquid increases and the cutting force of the removal liquid at the cutting position of the coated film increases, whereby the cutting accuracy of the cut surface is enhanced. Further, in this embodiment, the discharge flow rate of the removal liquid when the supply position P moves from the peripheral edge position to the first position (cutting position) is set to 20 to 60 ml/min. As a result, the discharge pressure of the removal liquid is increased, and the cutting accuracy of the cut surface is further enhanced.

Second Embodiment

Figure 6A:
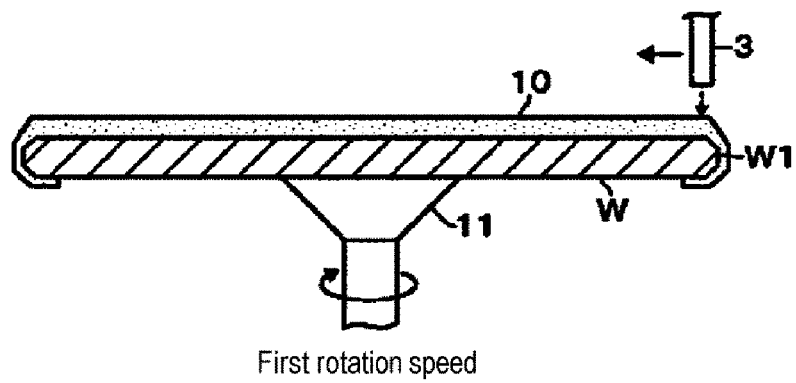
FIGS. 6A to 6D are vertical sectional side views showing the operation of the coating apparatus.
Figure 6B:
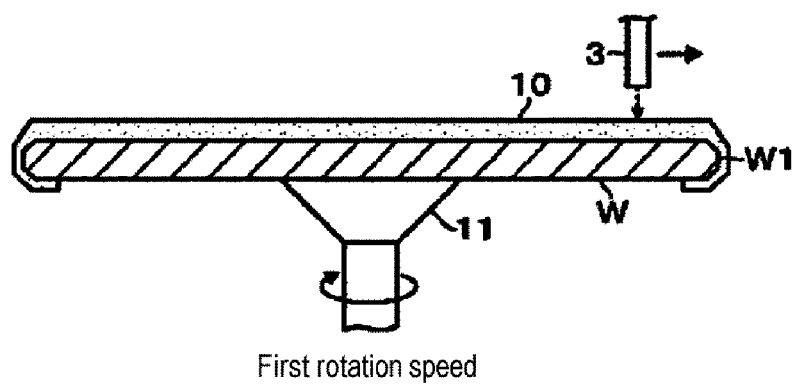
Figure 6C:
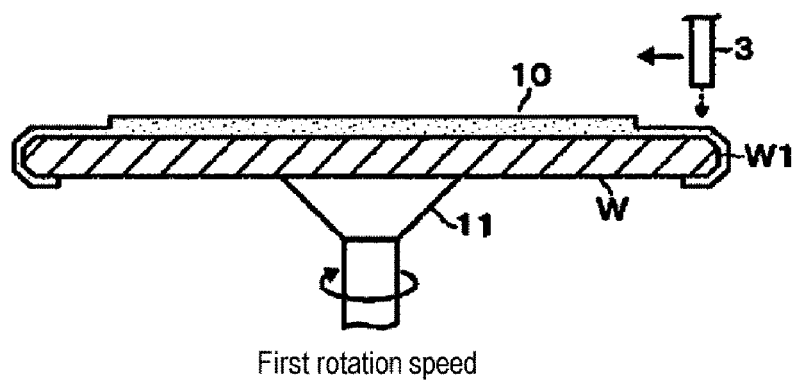
Figure 6D:
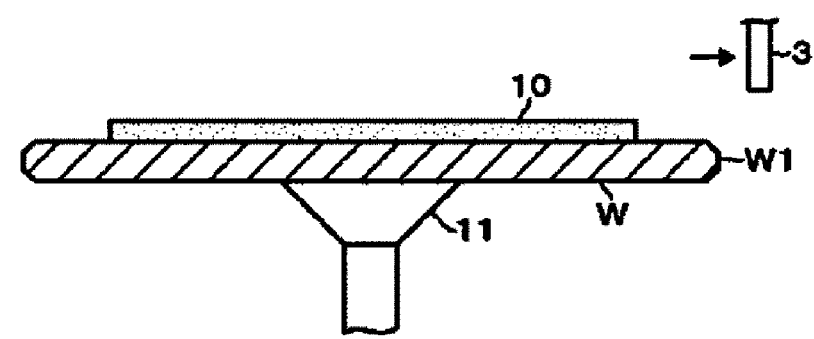

This embodiment differs from the above-described embodiment in that the control part 7 is configured to output a control signal for repeating the first step and the second step a multiple number of times. First, as shown in FIG. 6A, the removal liquid nozzle 3 is moved from the retraction position defined outside the wafer to the peripheral edge position. In a state in which the wafer W is rotated at a first rotation speed of 2,300 rpm or more, the removal liquid is discharged from the removal liquid nozzle 3 at a flow rate of, for example, 20 to 60 ml/min while moving the supply position P of the removal liquid from the peripheral edge position of the surface of the wafer W to the first position which is the cutting position (first step, FIG. 6B). Subsequently, the removal liquid nozzle 3 is moved from the first position to, for example, the peripheral edge position immediately, for example, within one second, after the supply position P of the removal liquid reaches the cutting position (second step, FIG. 6C). Even in the second step, the removal liquid is discharged from the removal liquid nozzle 3 at a flow rate of 20 to 60 ml/min in a state in which the wafer W is rotated at the first rotation speed of 2,300 rpm or more. Thus, the first step and the second step are repeated a multiple number of times, for example, five times.

By performing the first step and the second step in this manner, the unnecessary peripheral portion of the coated film can be removed while suppressing the occurrence of a bump as described above. Furthermore, by repeating the first step and the second step, the cutting force of the removal liquid at the cutting position of the coated film increases. Therefore, as is apparent from the evaluation tests described later, the cutting accuracy of the cut surface is increased. Moreover, by repeating the first step and the second step, the removal liquid easily goes around the end portion of the wafer W toward the rear surface side. This makes it possible to clean the beveled portion W1. After the first step and the second step are repeated as in the second embodiment, the cleaning step of the first embodiment may be performed.

As described above, by rotating the wafer W at a high rotation speed when discharging the removal liquid, it is possible to remove the unnecessary peripheral portion of the coated film while suppressing the occurrence of a bump. As is clear from the evaluation tests described later, the height of the bump at this time becomes lower as the rotation speed of the wafer W grows higher. On the other hand, if the rotation speed of the wafer W is increased, a liquid splash phenomenon easily occurs. Thus, there is a tendency that defects are generated and the smoothness of the cut surface tends to decrease. In view of the foregoing, the present inventors have found that, by rotating the wafer W at a rotation speed of 2,300 rpm or more when discharging the removal liquid, it is possible to remove the unnecessary peripheral portion of the coated film while suppressing the occurrence of a bump as compared with the related art.

[Example]

Next, the evaluation tests of the present disclosure will be described with reference to FIGS. 7 to 19.

(Evaluation Test 1: Hump Height Evaluation)

In a state in which the wafer W is rotated at 1,000 rpm, 2,000 rpm, 3,000 rpm and 4,000 rpm, a coated film forming step and an EBR step were performed. The height of a bump at the end portion of the coated film after processing was evaluated. The coated film is a chemical solution A which is a SOC (Spin On Carbon) material. The removal liquid is an OK-73 thinner. The cutting position is shifted inward by 2.5 mm from the outer edge of the wafer. The height of hump at each rotation speed was measured when the stop time of the supply position at the cutting position is 5 seconds and when the stop time was 0 seconds. The hump height was measured using a step difference measuring instrument. The height from the coated film was taken as the bump height. The bump height was similarly evaluated for a plurality of wafers W.

Figure 7:
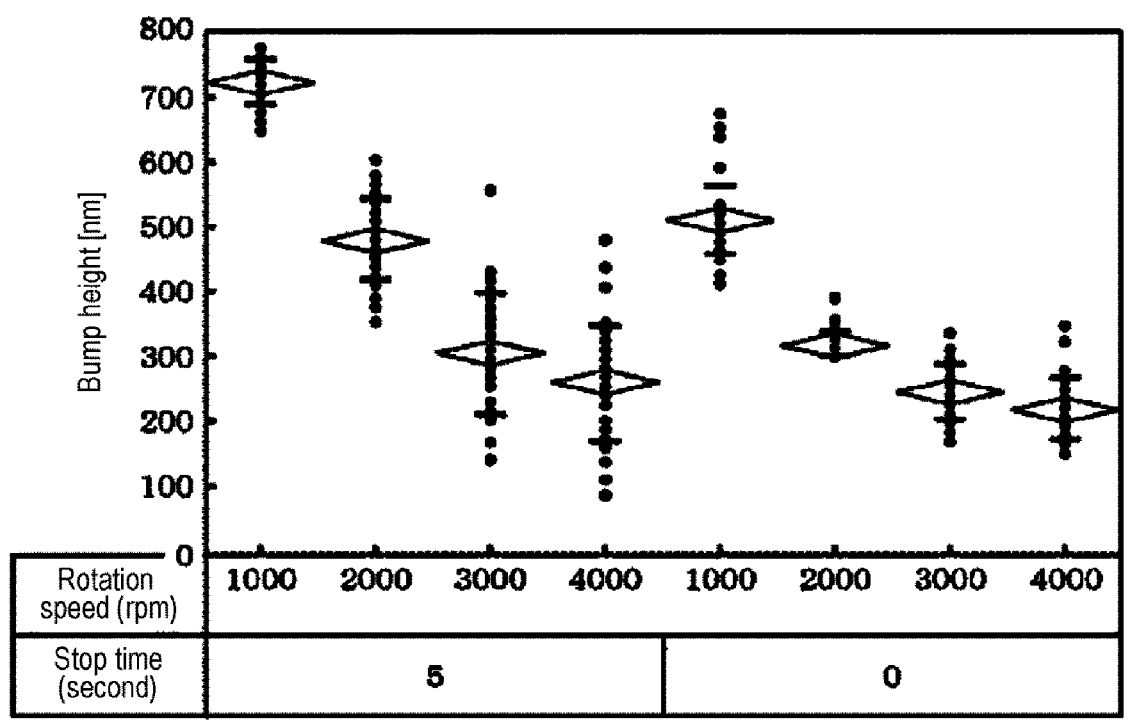
FIG. 7 is a characteristic diagram showing the results of an evaluation test.

The results are shown in FIG. 7. In FIG. 7, the vertical axis represents the bump height (nm), and the horizontal axis represents the stop time of the supply position of the removal liquid at the cutting position, and the rotation speed. The average value of the bump height when the stop time is 5 seconds was 724.92 nm at the rotation speed of 1,000 rpm, 481.31 nm at 2,000 rpm, 302.48 nm at 3,000 rpm, and 256.49 nm at 4,000 rpm. In addition, the average value of the bump height when the stop time is 0 seconds was 512.99 nm at the rotation speed of 1,000 rpm, 312.97 nm at 2,000 rpm, 240.76 nm at 3,000 rpm, and 209.35 nm at 4,000 rpm.

As described above, it was recognized that when the stop time is 5 seconds and 0 seconds, the bump height becomes lower as the rotation speed becomes higher. In addition, it was confirmed that when the rotation speeds are the same, even if the stop time is 0 seconds, the unnecessary film can be removed and the bump height is lowered. Accordingly, when the rotation speed is high, the force for pushing the removal liquid supplied to the cutting position toward the outer edge of the wafer W by virtue of a large centrifugal force increases, which increases the cutting force at the cutting position. Therefore, it is understood that even if the stop time is 0 seconds, the unnecessary film can be removed sufficiently.

The same evaluation was conducted by changing the coated film to a chemical solution B which is a resist, a chemical solution C which is a SOC material, a chemical solution D which is a resist, and a chemical solution E which is a SiARC material, and changing the removal liquid to an OK-73 thinner and cyclohexanone, respectively. As a result, as in evaluation test 1, it was confirmed that the higher the rotation speed, the lower the bump height becomes, and further that if the rotation speeds are the same, the bump height becomes lower when the stop time is 0 seconds. Therefore, it is understood that the technique of the present disclosure can reduce the bump height regardless of the type of coated film or the removal liquid.

As described above, the higher the rotation speed of the wafer W, the lower the bump height. However, from the transition of the bump height, it can be noted that since the change in the bump height becomes smaller when the rotation speed exceeds 3,000 rpm, a rotation speed of 2,300 rpm or more can sufficiently contribute to the reduction of the bump height. Regarding the stop time at the supply position, it can be seen that since the average value of the bump height is lower at the stop time of 5 seconds and the rotation speed of 3,000 rpm than at the stop time of 0 seconds and the rotation speed of 2,000 rpm, the bump height can be reduced if the stop time is within 1 second.

(Evaluation Test 2: Liquid Splash Evaluation)

A coated film forming step and an EBR step were performed, and the presence or absence of liquid splash was evaluated by capturing moving images of a processing state. At this time, the same evaluation was conducted by changing the angle θ to 0 degrees and 8.5 degrees, the angle Z to 10 degrees, 20 degrees and 30 degrees, the discharge flow rate of the removal liquid to 13 mL/min, 20 mL/min and 30 ml/min, respectively, in the removal liquid nozzle 3. In each case, the maximum rotation speed at which liquid splash does not occur was determined. The coated film is a chemical solution A, the removal liquid is an OK-73 thinner, the cutting position is shifted inward by 2.5 mm from the outer edge of the wafer, and the stop time of the supply position at the cutting position is 10 seconds.

Figure 8:
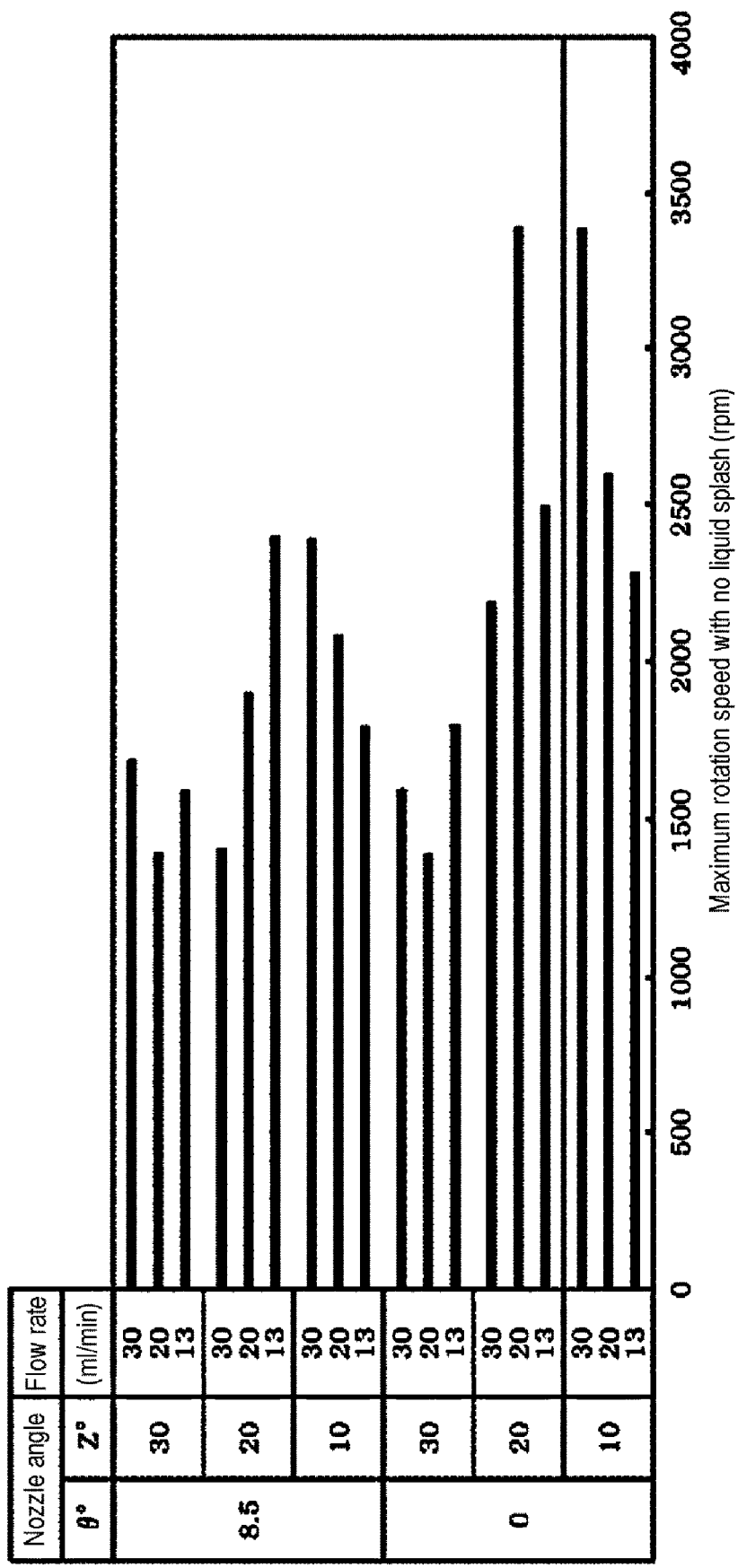
FIG. 8 is a characteristic diagram showing the results of an evaluation test.

The results are shown in FIG. 8. In FIG. 8, the horizontal axis represents the maximum rotation speed (rpm) at which no liquid splash occurs, and the vertical axis represents angles (angles θ and Z) of the removal liquid nozzle 3 and discharge flow rates (ml/min). As a result, when comparing the angles θ formed by the removal liquid nozzle 3 and the tangent line, it was confirmed that the maximum rotation speed becomes larger at 0 degrees. When comparing the angles Z formed by the removal liquid nozzle 3 and the wafer surface, it was confirmed that the maximum rotation speed becomes larger at 10 degrees and 20 degrees than at 30 degrees. As a result, it is understood that the liquid splash can be reduced by adjusting the angle θ and the angle Z. In addition, it was confirmed that even when the angles θ or the angles Z formed by the removal liquid nozzle 3 remain the same, the maximum rotation speed varies depending on the discharge flow rate. Furthermore, a coated film was formed on the wafer W having an unevenness of ±300 μm formed thereon, and an EBR process was performed using the removal liquid nozzle 3 having the angle θ of 8.5 degrees and the angle Z of 30 degrees and the removal liquid nozzle 3 having the angle θ of 0 degree and the angle Z of 10 degrees. As a result, it was confirmed that the cutting accuracy is enhanced in the case of the removal liquid nozzle 3 having the angle θ of 0 degree and the angle Z of 10 degrees.

As a result, it was confirmed that when the angle θ is 8.5 degrees, if the angle Z is 20 degrees or less, the maximum rotation speed exceeds 2,300 rpm. In view of this, it can be noted that when the angle θ is within 6 degrees, even if the maximum rotation speed is 2,300 rpm or more, liquid splash can be reduced by adjusting the discharge flow rate or the angle Z, and further that when the angle Z is within 20 degrees or less, even if the maximum rotation speed is 2,300 rpm or more, liquid splash can be reduced by adjusting the discharge flow rate or the angle θ.

(Evaluation Test 3: Defect Evaluation)

After the coated film forming step, the EBR step was performed by rotating the wafer W at 4,000 rpm and reciprocating the removal liquid nozzle 3 once between the peripheral edge position of the wafer W and the cutting position while discharging the removal liquid from the removal liquid nozzle 3. The number of defects (wet particles) was evaluated by extracting mist-like defects using an SEM (scanning electron microscope).

At this time, the removal liquid nozzle 3 having the angle θ of 0 degree, the angle Z of 10 degrees and the diameter A of the discharge port 30 of 0.2 mm, and the removal liquid nozzle 3 having the angle θ of 8.5 degrees, the angle Z of 30 degrees and the diameter A of the discharge port 30 of 0.3 mm were used. The coated film is a chemical solution A, the removal liquid is an OK-73 thinner, the exhaust pressure in the coated film forming step is 65 Pa, and the exhaust pressure inside the cup 22 in the EBR step is 75 Pa. In addition, the stop time of the supply position at the cutting position is 0 seconds. Evaluation was conducted by changing the cutting position (cutting width).

Figure 9:
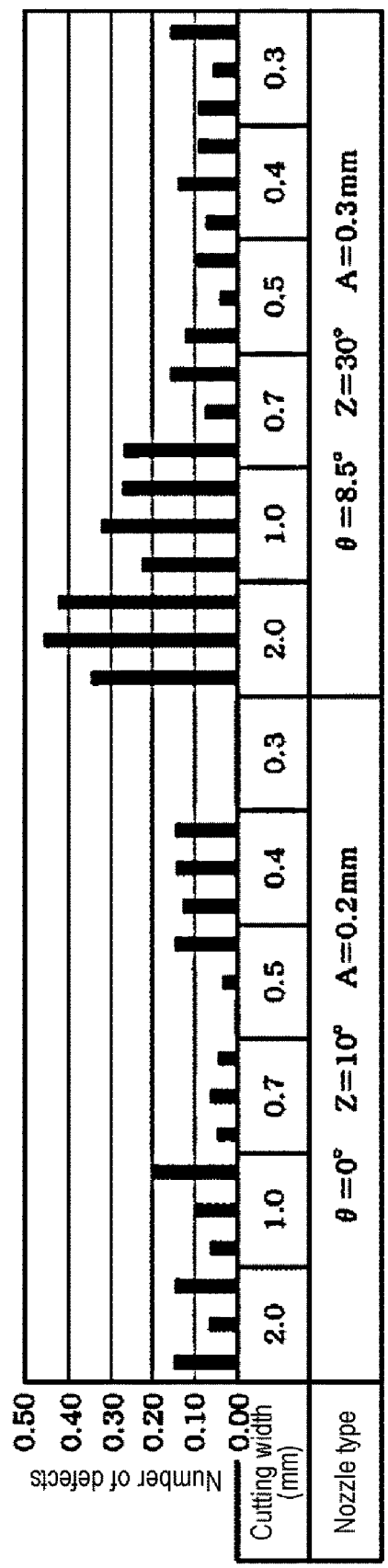
FIG. 9 is a characteristic diagram showing the results of an evaluation test.

Under the respective conditions, the same evaluation was conducted with respect to three wafers W. The results are shown in FIG. 9. In FIG. 9, the horizontal axis represents the cutting width and the conditions of the removal liquid nozzle 3, and the vertical axis represents the number of mist-like defects having a size of 50 nm or more. As a result, it was confirmed that the number of mist-like defects can be greatly reduced by using the removal liquid nozzle 3 having the angle θ of 0 degrees and the angle Z of 10 degrees. Since it was confirmed in evaluation test 2 that the liquid splash can be reduced by optimizing the angle θ of the removal liquid nozzle 3, it is inferred that the mist-like defects were reduced by suppressing the liquid splash.

(Evaluation Test 4-1: Exhaust Pressure Evaluation)

After the coated film forming step, the EBR step was performed by rotating the wafer W at 4,000 rpm and reciprocating the removal liquid nozzle 3 sixty times between the peripheral edge position of the wafer W and the cutting position while discharging the removal liquid from the removal liquid nozzle 3. The number of defects was evaluated using an SEM. At this time, the removal liquid nozzle 3 having the angle θ of 0 degrees, the angle Z of 10 degrees and the diameter A of the discharge port 30 of 0.2 mm was used. The coated film is a chemical solution B, the removal liquid is an OK-73 thinner, the stop time of the supply position at the cutting position is 0 seconds, the cutting width is 2 mm, and the discharge flow rate is 25 ml/min. The processing was carried out by changing the exhaust pressure of the cup 22 in the EBR step. Then, the evaluation was conducted. The reason for reciprocating the removal liquid nozzle 3 sixty times is to accurately grasp the generation of defects by increasing the number of defects which grows larger along with the increase in the number of processing times.

Figure 10:
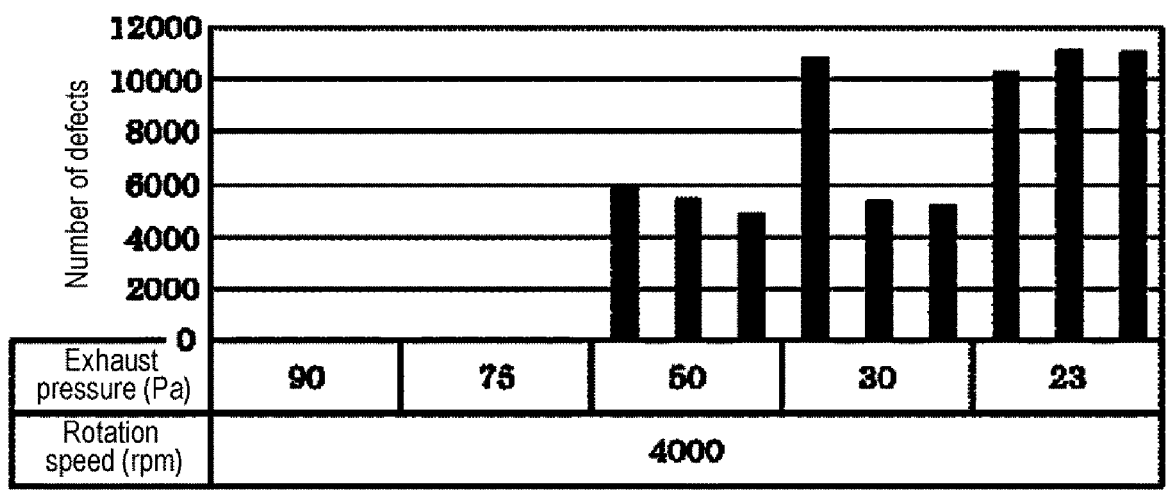
FIG. 10 is a characteristic diagram showing the results of an evaluation test.

Under the respective conditions, the same evaluation was conducted for each of the three wafers W. The results are shown in FIG. 10. In FIG. 10, the horizontal axis represents the exhaust pressure inside the cup 22, and the vertical axis represents the number of defects having a size of 50 nm or more. As a result, it was confirmed that when the exhaust pressure inside the cup 22 is increased, the number of defects is reduced, and further that when the rotation speed is 4,000 rpm, defects are generated at 50 Pa or less.

(Evaluation Test 4-2: Exhaust Pressure Evaluation)

Figure 11:
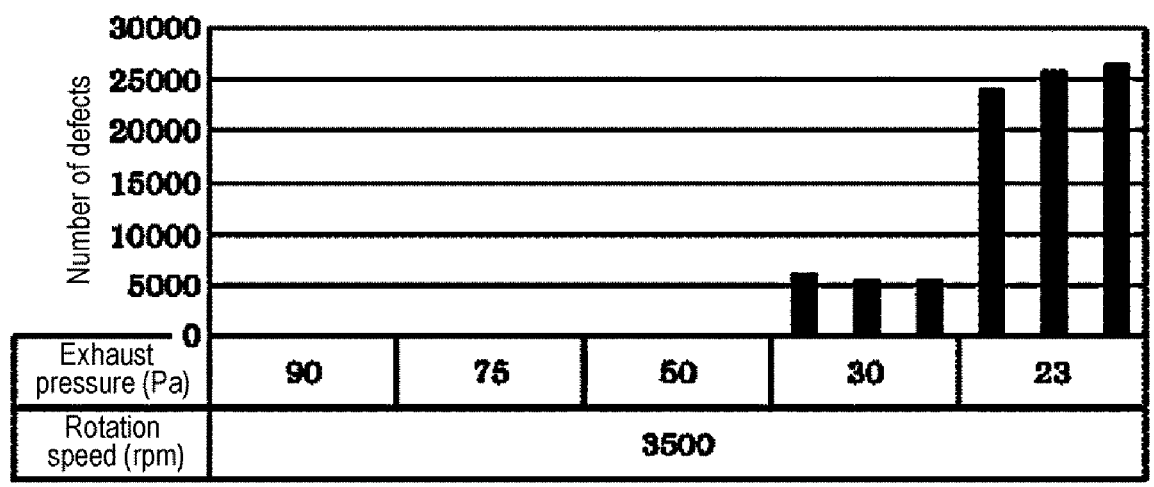
FIG. 11 is a characteristic diagram showing the results of an evaluation test.

Evaluation was conducted in the same manner as in evaluation test 4-1 by changing the rotation speed of the wafer W to 3,500 rpm and maintaining other conditions as they are. Under the respective conditions, the same evaluation was conducted for each of the three wafers W. The results are shown in FIG. 11. In FIG. 11, the horizontal axis represents the exhaust pressure inside the cup 22, and the vertical axis represents the number of defects having a size of 50 nm or more. As a result, it was confirmed that when the rotation speed is 3,500 rpm, defects are generated at 30 Pa or less.

(Evaluation Test 4-3: Exhaust Pressure Evaluation)

Figure 12:
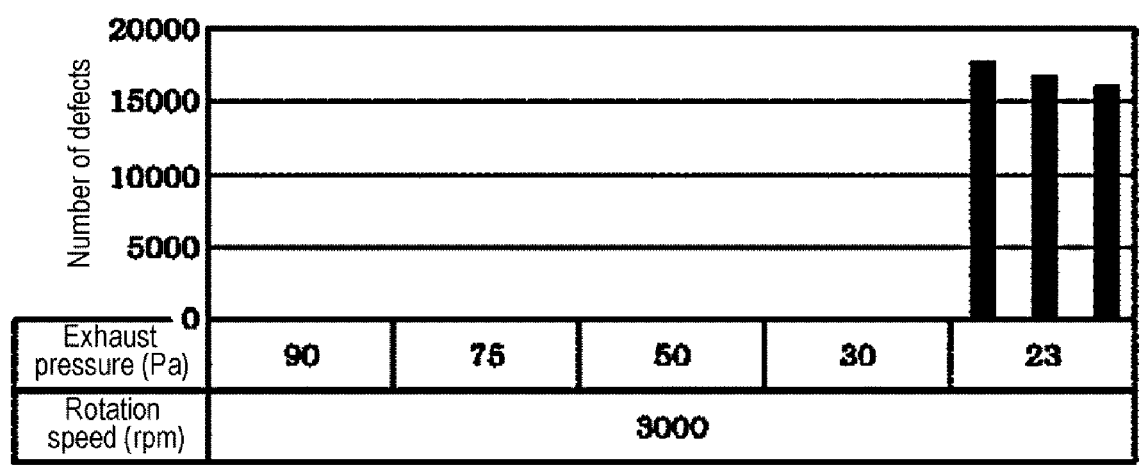
FIG. 12 is a characteristic diagram showing the results of an evaluation test.

Evaluation was conducted in the same manner as in evaluation test 4-1 by changing the rotation speed of the wafer W to 3,000 rpm and maintaining other conditions as they are. Under the respective conditions, the same evaluation was conducted for each of the three wafers W. The results are shown in FIG. 12. In FIG. 12, the horizontal axis represents the exhaust pressure inside the cup 22, and the vertical axis represents the number of defects having a size of 50 nm or more. As a result, it was confirmed that when the rotation speed is 3,000 rpm, defects are generated at an exhaust pressure of 23 Pa.

(Evaluation Test 4-4: Exhaust Pressure Evaluation)

Figure 13:
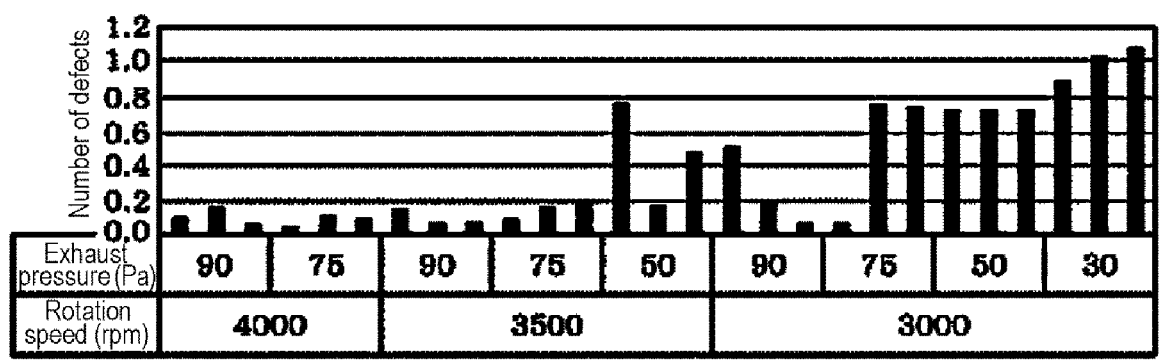
FIG. 13 is a characteristic diagram showing the results of an evaluation test.

After the coated film forming step, the rotation speed of the wafer W was set to 3,000 rpm, 3,500 rpm and 4,000 rpm, and an EBR step was performed by moving the removal liquid nozzle 3 once from the peripheral edge position of the wafer W to the cutting position while discharging the removal liquid from the removal liquid nozzle 3. Evaluation was conducted in the same manner as in evaluation test 4-1 by maintaining other conditions as they are. Under the respective conditions, the same evaluation was performed for three wafers W. The results are shown in FIG. 13. In FIG. 13, the horizontal axis represents the exhaust pressure inside the cup 22, and the vertical axis represents the number of mist-like defects having a size of 50 nm or more. As a result, it was confirmed that defects are prone to be generated as the rotation speed of the wafer W increases, and further that the number of defects can be reduced by increasing the exhaust pressure inside the cup 22. In addition, when comparing at the same exhaust pressure (75 Pa or 90 Pa), it was confirmed that the number of mist-like defects is increased at a relatively high rotation speed. This is presumably because liquid splash tends to occur at the notch portion of the wafer W when the rotation speed is lowered, which causes the number of mist-like defects to increase.

(Evaluation Test 5-1: Beveled Portion Cleaning Evaluation)

After the coated film forming step, an EBR step was performed by rotating the wafer W at 4,000 rpm and setting the stop time at the first position (cutting position) to 0 seconds. Then, a cleaning step was performed by moving the supply position to the second position and rotating the wafer W at 2,000 rpm. The stop time at the second position was changed between 1 second and 5 seconds, and the degree of cleanliness of the beveled portion W1 was measured using a bevel inspection device. The removal liquid nozzle 3 having the angle θ of 0 degrees, the angle Z of 10 degrees and the diameter A of the discharge port 30 of 0.2 mm was used. The coated film is a chemical solution B, the removal liquid is an OK-73 thinner, the cutting position is shifted inward by 2 mm from the outer edge of the wafer, and the second position is shifted inward by 0.5 mm from the outer edge of the wafer.

As a result, it was confirmed that the degree of cleanliness of the beveled portion W1 can be improved by performing the cleaning step after the EBR step, and further that the degree of cleanliness of the beveled portion W1 can be made higher by prolonging the supply time of the removal liquid at the second position. It was confirmed that if the supply time of the removal liquid at the second position is 3 seconds or more, the decrease in contamination of the beveled portion W1 is improved.

(Evaluation Test 5-2: Beveled Portion Cleaning Evaluation)

An EBR step and a cleaning step were performed in the same manner as in evaluation test 5-1. The degree of cleanness of the beveled portion was checked by setting the stop time at the second position to 5 seconds and by changing the rotation speed (second rotation speed) of the wafer W in the cleaning step and the exhaust pressure inside the cup 22. The coated film is a chemical solution B, the removal liquid is an OK-73 thinner, the cutting position is shifted inward by 2 mm from the outer edge of the wafer, and the second position is shifted inward by 0.5 mm from the outer edge of the wafer. Evaluation was also conducted similarly even in the case where the cleaning step is not performed.

Figure 14:
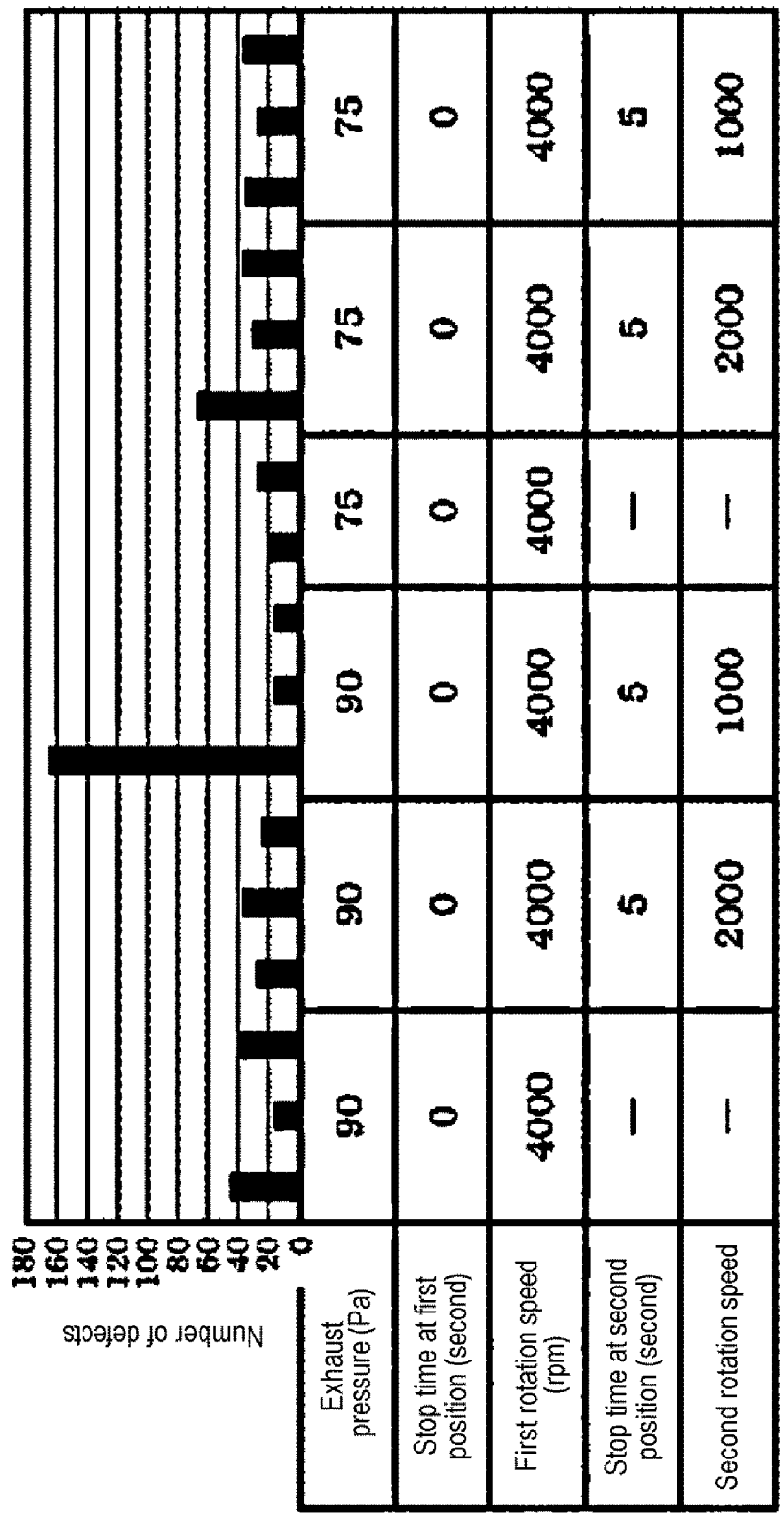
FIG. 14 is a characteristic diagram showing the results of an evaluation test.

Under the respective conditions, the same evaluation was conducted for each of three wafers W. The results are shown in FIG. 14. In FIG. 14, the horizontal axis represents processing conditions such as an exhaust pressure, a rotation speed and the like, and the vertical axis represents the number of defects having a size of 50 nm or more. The stop time at the second position and the second rotation speed are not shown in the case where the cleaning step is not performed. As a result, under the condition that the exhaust pressure is 90 Pa and the second rotation speed is 1,000 rpm, there are some wafers W with a large number of defects. However, the number of defects is small for the remaining wafers W under the same conditions. Therefore, it can be said that even when the cleaning step is performed, the number of defects does not deteriorate.

Figure 15:
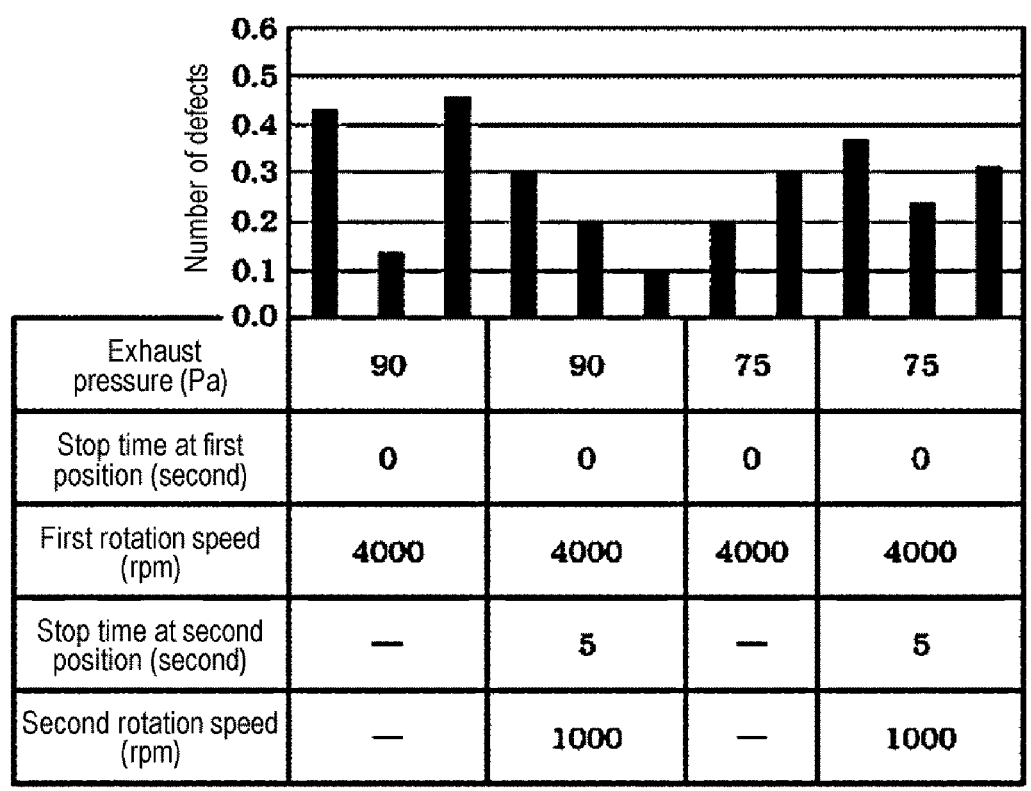
FIG. 15 is a characteristic diagram showing the results of an evaluation test.

With respect to evaluation test 5-2, the number of mist-like defects having a size of 50 nm or more was evaluated by a defect review SEM (Scanning Electron Microscope). The results are shown in FIG. 15. Even in this case, it was confirmed that the number of defects is not deteriorated by performing the cleaning step.

(Evaluation Test 6-1: Cut Surface Evaluation)

After the coated film forming step, an EBR step was performed by setting the stop time at the cutting position to 0 seconds. At this time, the removal liquid nozzle 3 having the angle θ of 0 degrees, the angle Z of 10 degrees and the diameter A of the discharge port 30 of 0.3 mm, and the removal liquid nozzle 3 having the angle θ of 8.5 degrees, the angle Z of 30 degrees and the diameter A of the discharge port 30 of 0.3 mm were used. The coated film is a chemical solution A, the removal liquid is an OK-73 thinner, and the cutting width is 2.5 mm. The EBR step was performed by changing the discharge flow rate and the rotation speed. Then, evaluation was conducted. The smoothness of the cut surface was evaluated by a bevel inspection device.

Figure 16:
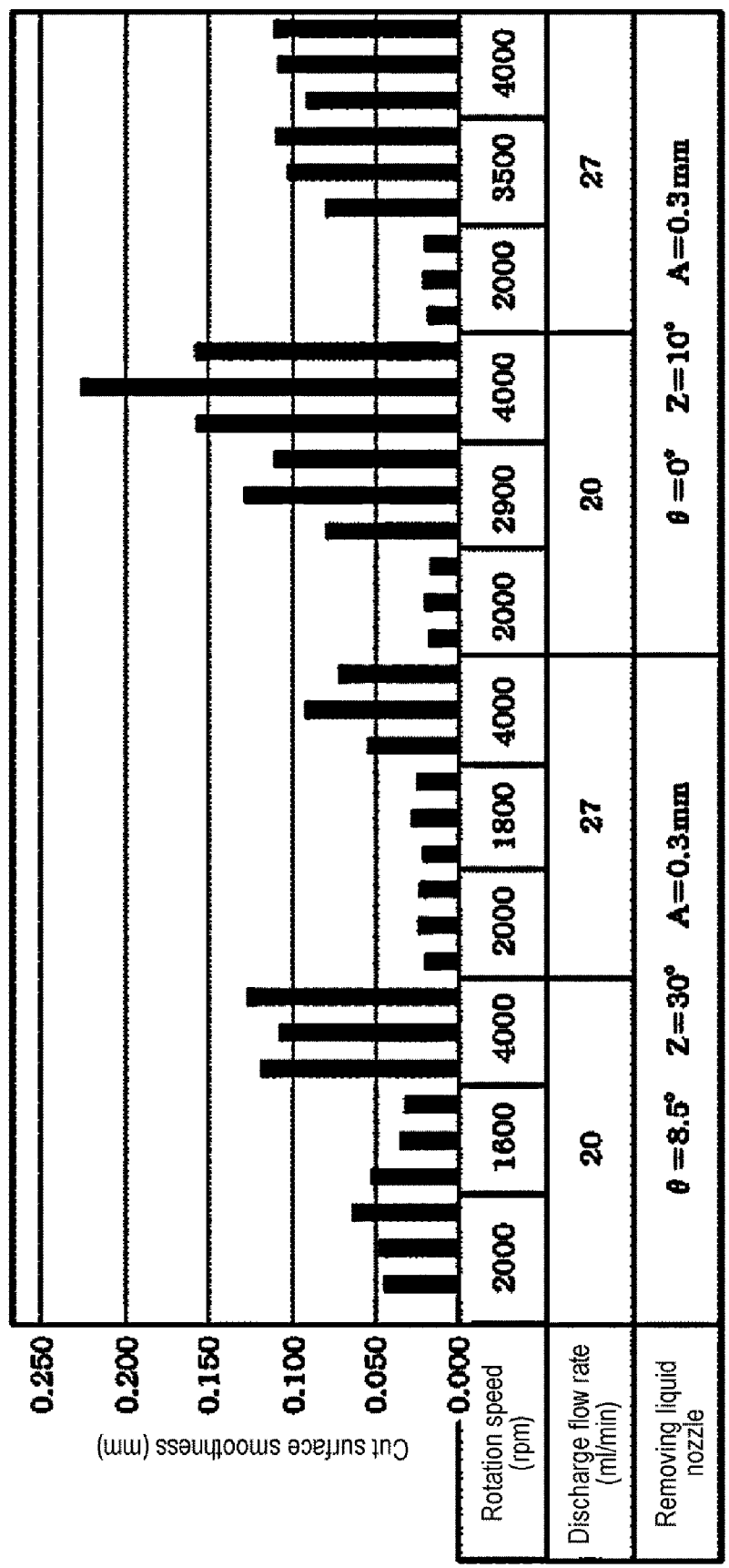
FIG. 16 is a characteristic diagram showing the results of an evaluation test.

Under the respective conditions, the same evaluation was conducted for each of the three wafers W. The results are shown in FIG. 16. In FIG. 16, the horizontal axis represents processing conditions such as a discharge flow rate, a rotation speed and the like, and the vertical axis represents the smoothness (mm) of the cut surface. The smaller the numerical value of the smoothness, the less the roughness of the cut surface and the higher the smoothness. As a result, it was confirmed that when the removal liquid nozzle 3 having the angle θ of 0 degrees and the angle Z of 10 degrees is used, the smoothness of the cut surface deteriorates. However, it was confirmed that although the smoothness deteriorates if the rotation speed is increased, the smoothness can be improved by increasing the discharge flow rate.

(Evaluation Test 6-2: Cut Surface Evaluation)

Figure 17:
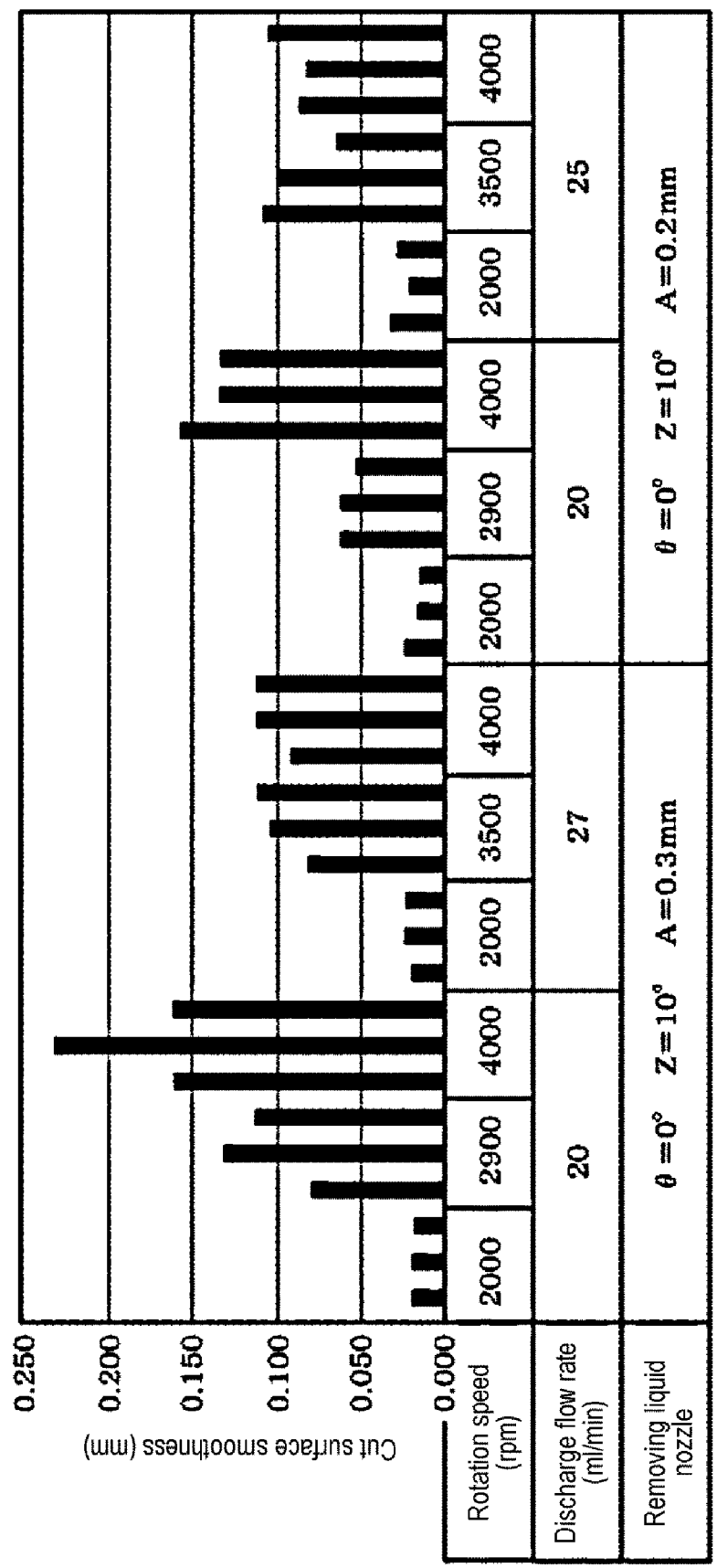
FIG. 17 is a characteristic diagram showing the results of an evaluation test.

The removal liquid nozzle 3 having the angle θ of 0 degrees and the angle Z of 10 degrees was used, and the diameter A of the discharge port 30 was set to 0.3 mm and 0.2 mm. Other conditions are the same as those of evaluation test 6-1. The smoothness of the cut surface was evaluated. The results are shown in FIG. 17. In FIG. 17, the horizontal axis represents processing conditions such as a discharge flow rate, a rotation speed and the like, and the vertical axis represents the smoothness (mm) of the cut surface. As a result, it was recognized that the smoothness of the cut surface can be improved by reducing the diameter A of the discharge port 30 in the removal liquid nozzle 3 having the angle θ of 0 degrees and the angle Z of 10 degrees. It was also confirmed that the smoothness of the cut surface can be improved by increasing the discharge flow rate.

When the diameter A of the discharge port 30 of the removal liquid nozzle 3 is 0.3 mm, if the discharge flow rate is set to 27 ml/min, the smoothness is approximately the same at the rotation speeds of 3,500 rpm and 4,000 rpm. Therefore, it can be noted that the diameter A of the discharge port 30 of the removal liquid nozzle 3 is preferably 0.15 mm to 0.35 mm. In the comparison of the diameters A of 0.3 mm and 0.2 mm at the time of the discharge flow rate being 20 ml/min, if the rotation speed is 2,900 rpm or more, the smoothness is better when the diameter A is 0.2 mm. Therefore, it can be said that the smoothness of the cut surface is sufficiently improved if the diameter A of the discharge port 30 of the removal liquid nozzle 3 is 0.15 mm to 0.25 mm.

(Evaluation Test 6-3: Cut Surface Evaluation)

After the coated film forming step, the wafer W was rotated at 4,000 rpm, and an EBR step was performed by setting the stop time at the cutting position to 0 seconds. Subsequently, the cleaning step was performed by moving the supply position to the second position, setting the stop time at the second position to 5 seconds, and rotating the wafer W at 2,000 rpm. The smoothness of the cut surface was checked by changing the discharge flow rate of the removal liquid in the EBR step and the cleaning step. The coated film is a chemical solution A, the removal liquid is an OK-73 thinner, the diameter A of the discharge port 30 is 0.2 mm, the cutting position is shifted inward by 2 mm from the outer edge of the wafer, and the second position is shifted inward by 0.5 mm from the outer edge of the wafer.

Figure 18:
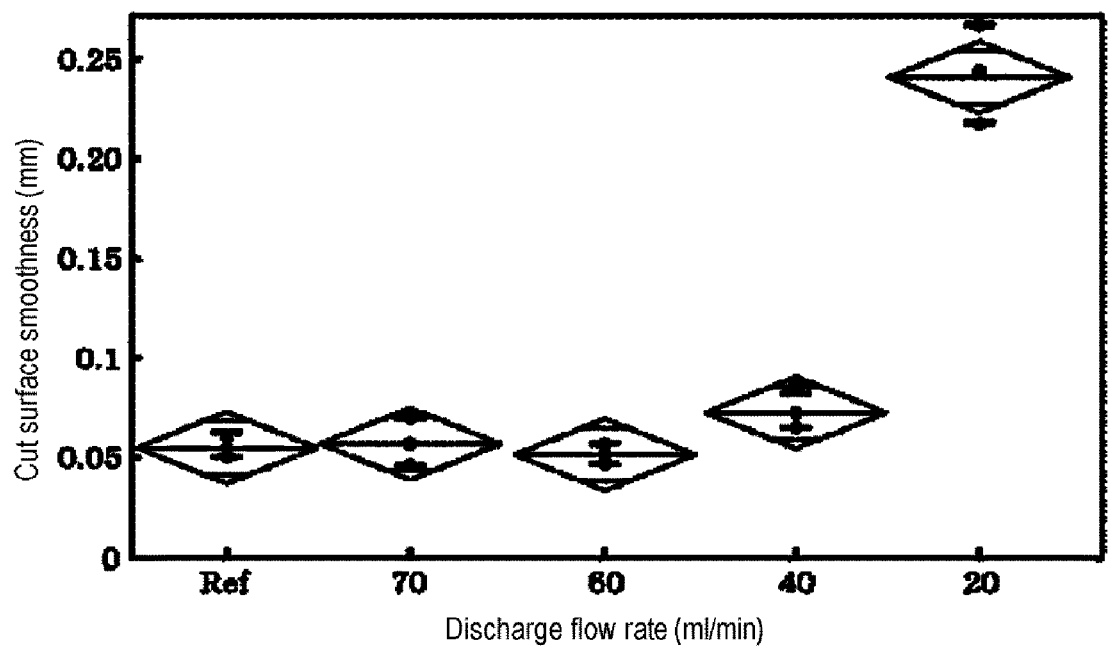
FIG. 18 is a characteristic diagram showing the results of an evaluation test.

The results are shown in FIG. 18. In FIG. 18, the horizontal axis represents the discharge flow rate, the vertical axis represents the smoothness (mm) of the cut surface, and the term "Ref" represents the data available when the cleaning step is performed using the removal liquid nozzle 3 having the angle θ of 8.5 degrees and the angle Z of 30 degrees under the condition that the stop time at the cutting position is 5 seconds and the rotation speed of the wafer W is 2,000 rpm. As a result, it was recognized that, in the removal liquid nozzle 3 having the angle θ of 0 degrees and the angle Z of 10 degrees, the smoothness of the cut surface can be improved by increasing the discharge flow rate. Since the smoothness is greatly improved when the discharge flow rate is 40 ml/min or more, it can be noted that the smoothness of the cut surface can be sufficiently improved if the discharge flow rate is 40 ml/min to 70 ml/min.

(Evaluation Test 7: Discharge Flow Rate Evaluation)

Figure 19:
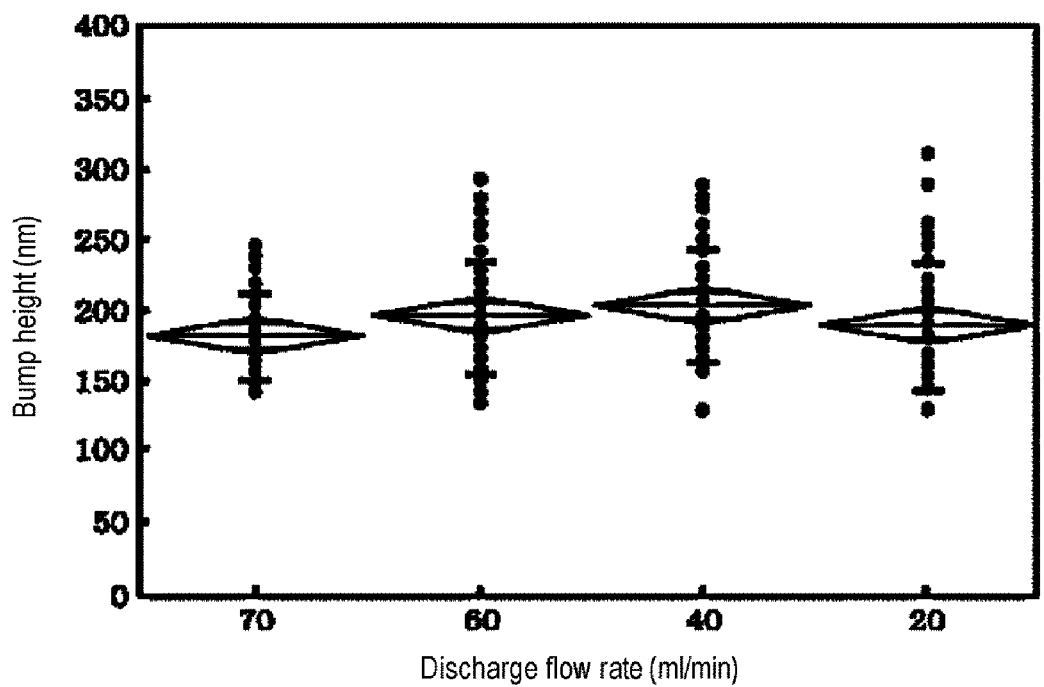
FIG. 19 is a characteristic diagram showing the results of an evaluation test.

With respect to the wafer W processed in the same manner as in evaluation test 6-3, the hump height was checked by a step difference measuring instrument. The results are shown in FIG. 19. In FIG. 19, the horizontal axis represents the discharge flow rate, and the vertical axis represents the hump height (nm). As a result, it was recognized that the increase in the discharge flow rate does not increase the hump height.

In the coating apparatus 1 of the present disclosure described above, in order to reduce the hump height, the wafer W may be rotated at a rotation speed of 2,300 rpm or more when the removal liquid is discharged from the removal liquid nozzle 3. In the coating apparatus 1, the following operations (a) to (g) can be appropriately combined.

(a) Performing the first step and the second step
(b) Performing the cleaning step
(c) Repeating the first step and the second step a multiple number of times
(d) Setting the angle θ formed by the removal liquid nozzle 3 and the tangent line to 6 degrees or less
(e) Setting the angle Z formed by the removal liquid nozzle 3 and the wafer surface to 20 degrees or less
(f) Setting the diameter A of the discharge port 30 of the removal liquid nozzle 3 to 0.15 to 0.35 mm
(g) Setting the discharge flow rate of the removal liquid discharged from the removal liquid nozzle 3 to 20 ml/min to 60 ml/min In coating apparatus 1 described above, the EBR process may be performed on a wafer W on which a coated film is formed by an external apparatus. In other words, the coating apparatus 1 may be configured as a dedicated apparatus for performing only the EBR process. In this case, there is no need to provide the coating liquid nozzle 41 and the solvent nozzle 42. The coating liquid may be, for example, a resist solution, an SOD material, an SOC material, a SiARC material, a BARC material or an organic film mainly composed of carbon, which is obtained by dissolving a component of a coating film in a solvent, and may be applied to various coated films which are softened by a solvent.

Moreover, in order to form, for example, a NAND type flash memory called a 3D NAND in which wirings are formed in a plurality of layers, there may be case where a coated film such as a resist film or the like is formed on a wafer W having a large number of laminated films by a coating apparatus. There is a case where the respective wafers W transferred to a coating apparatus in such a state that a large number of films are formed thereon are warped so as to have different shapes due to the influence of the processes performed so far and the stress received from each film.

Since the spin chuck 11 of the coating apparatus 1 attracts only the central portion of the wafer W, the wafer W having a bump at the time of being transferred is subjected to the process in a warped state. Under such circumstances, the removal liquid nozzle 3 of the coating apparatus 1 may be configured so that the accuracy of the EBR process is not reduced by the bump. Specifically, in order to prevent the distance from the end of the wafer W to the supply position P (see FIG. 3) from being shifted and to prevent the cutting width from deviating from a set value even if the wafer W has a bump, the angle θ of the removal liquid nozzle 3 described with reference to FIG. 3 is set to a value close to 0 degrees, specifically 0 degrees to 5 degrees, more specifically 0 degrees to 3 degrees. Additionally describing the cutting width, the cut width is the width of an annular region from which the coated film is removed by the removal liquid discharged from the removal liquid nozzle 3 onto the surface of the wafer W.

As the angle Z described with reference to FIG. 4 comes close to 90 degrees, the deviation between a predetermined discharge position and the actual discharge position, which is caused by the bump on the wafer W, is suppressed, and the cutting width is less susceptible to warping. However, as described above, when discharging the removal liquid to the wafer W rotating at a relatively high speed, as the angle Z comes close to 0 degrees, it is possible to further reduce the pressure when the removal liquid is applied to the wafer W. Therefore, the effect of suppressing the splash of the removal liquid on the surface of the wafer W is enhanced. Accordingly, when the angle θ is set to 0 degrees to 5 degrees as described above, the angle Z may be 5 degrees to 20 degrees.

Figure 20A:
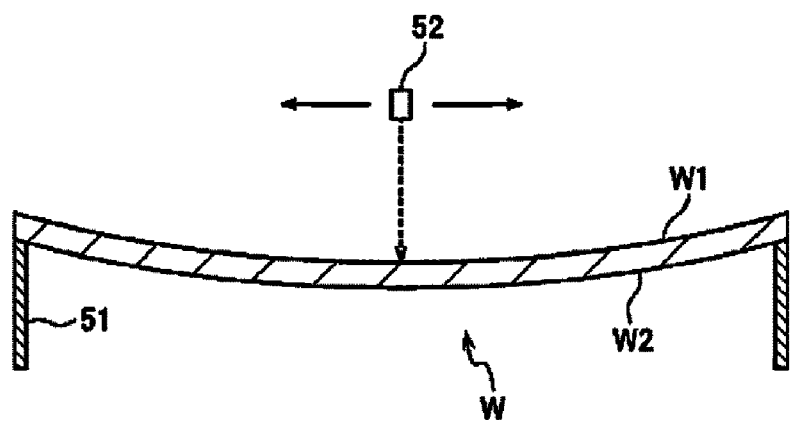
FIGS. 20A and 20B are vertical sectional side views of a wafer.
Figure 20B:
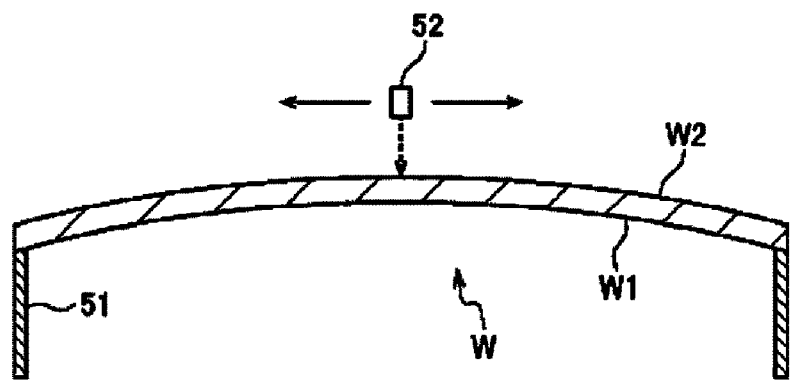

An evaluation test conducted to confirm appropriate values for the angle θ and the angle Z will be described in detail later. In this evaluation test, the amount of warping of the wafer W is measured in advance before performing the test. The measurement of the warp amount will be described with reference to FIGS. 20A and 20B. In FIGS. 20A and 20B, a front surface of the wafer W is denoted by W1, and a rear surface of the wafer W is denoted by W2. In FIGS. 20A and 20B, reference numeral 51 denotes a mounting part on which the wafer W is mounted. The wafer W is mounted so that only the peripheral portion of the wafer W is supported from below. In FIGS. 20A and 20B, reference numeral 52 denotes a laser displacement meter, which is configured to be laterally movable above the wafer W in order to measure the height of each portion of the upper surface of the wafer W mounted on the mounting part 51.

The height of each portion in the front surface W1 of the wafer W is acquired in a state in which the wafer W is mounted on the mounting part 51 so that the front surface W1 is oriented upward as shown in FIG. 20A. A warp amount (referred to as a front surface-side warp amount) is acquired from the height of each part thus obtained. Further, the height of each portion in the rear surface W2 of the wafer W is acquired in a state in which the wafer W is mounted on the mounting part 51 so that the rear surface W2 is oriented upward as shown in FIG. 20B. A warp amount (referred to as a rear surface-side warp amount) is acquired from the height of each part thus obtained. Then, the average value of the front surface-side warp amount and the rear surface-side warp amount is defined as a warp amount of the wafer W. Only a portion of the surface of the wafer W is supported by the mounting part 51 and the wafer W is deformed by its own weight. Thus, by calculating the warp amount of the wafer W based on the front surface-side warp amount and the rear surface-side warp amount in this manner, the measurement error due to the wafers own weight is canceled. The front surface-side warp amount is calculated, for example, by measuring the height of a plurality of points in the front surface W1, calculating the height of a reference plane from the acquired height of all the points by a least square method, and adding up a distance between the reference plane and the height of the highest point among the measured points and a distance between the reference plane and the height of the lowest point among the measured points. The rear surface-side warp amount is calculated by the same method as the method of calculating the front surface-side warp amount.

In the evaluation tests to be described later, the wafer W having the height of the peripheral portion higher than the height of the central portion in the entire circumference of the wafer W when the front surface of the wafer W is oriented upward as shown in FIG. 20A will be called a concave wafer W. Furthermore, the wafer W having the height of the peripheral portion lower than the height of the central portion in the entire circumference of the wafer W when the front surface of the wafer W is oriented upward will be called a convex wafer W. In addition, the wafer W warped so that the height of the circumferential end of the wafer W is higher and lower than the height of the center of the wafer W when viewed along the circumferential direction of the wafer W will be called a concavo-convex wafer W.

(Evaluation Test 8)

In evaluation test 8, an EBR process was performed by setting the cutting width to 1 mm with respect to the wafers W having different warp amounts. The cutting widths at a plurality of positions on the circumference of the wafer W were measured after the process, and the average value of the cutting widths was calculated. The EBR process was performed using any one of three removal liquid nozzles 3 in which the combinations of the angle θ and the angle Z are set to be different from each other. One of the three removal liquid nozzles 3 is set such that θ=0° and Z=10°, and is defined as a nozzle 3-1. Another removal liquid nozzle 3 is set such that θ=8.5° and Z=30°, and is defined as a nozzle 3-2. The remaining removal liquid nozzle 3 is set such that θ=30° and Z=30°, and is defined as a nozzle 3-3. The test was conducted using the wafer W having no warp, i.e., having a warp amount of 0 μm, the concave wafer W having a warp amount of 196 μm shown in FIG. 20A, and the convex wafer W having a warp amount of 232 μm.

Figure 21:
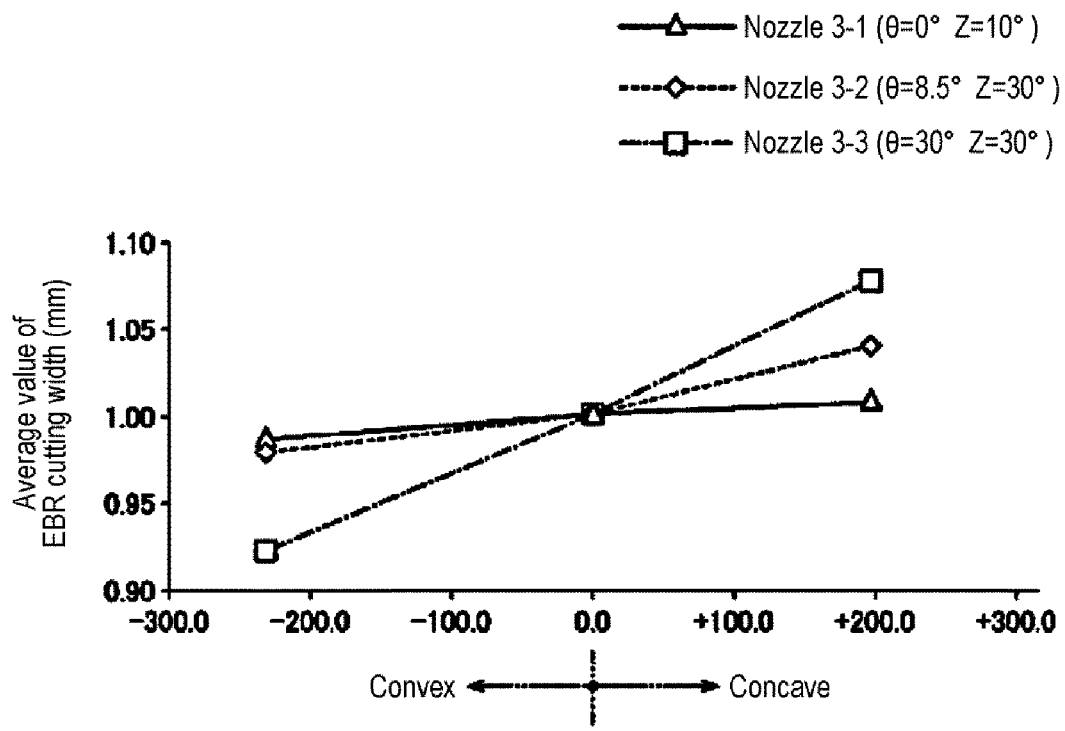
FIG. 21 is a characteristic diagram showing the results of an evaluation test.

The graph of FIG. 21 shows the results of evaluation test 8. The horizontal axis of the graph indicates the warp amount (unit: μm) of the wafer W. The sign of + is given to the warp amount of the concave wafer W and the sign of − is given to the warp amount of the convex wafer W. The vertical axis of the graph indicates the average value (unit: mm) of the cutting widths. As shown in the graph, in the case of using the nozzle 3-3, if the wafer W is warped, the average value of the cutting widths deviates relatively much from 1 mm which is a set value. In the case of using the nozzle 3-2, the deviation is suppressed as compared with the case of using the nozzle 3-3. However, the amount of deviation between the average value of the cutting widths and the set value 1 mm when the warp amount is +196 mm is slightly larger than the practically effective level. In the case of using the nozzle 3-1, the average value of the cutting widths substantially coincides with the set value of the cutting width in all cases where the warp amount is 0 mm, +196 mm and −232 mm. Accordingly, it was confirmed from evaluation test 8 that the accuracy of the cut width can be effectively increased by using the nozzle 3-1 in the range where the warp amount of the wafer W is +196 μm to −232 μm.

From the respective results obtained by using the nozzles 3-2 and 3-3 differing only in the value of θ out of the angles θ and Z, it can be noted that the fluctuation of the average value of the cutting width due to the warp of the wafer W can be suppressed by changing the angle θ. In the case of using the nozzle 3-1 in which θ=0, it is possible to sufficiently suppress the deviation of the average value of the cutting widths from the set value of the cutting width. Furthermore, for θ=8.5°, the amount of deviation is slightly larger as described above. Accordingly, it is considered that the deviation can be sufficiently suppressed when the value of θ is larger than 0° and slightly smaller than 8.5°, for example, when θ=0° to 5° as described above. In the case of using the nozzle 3-1, the value of Z is 10°, and the deviation between the average value of the cutting widths and the warp amount is suppressed. However, in the case of using the nozzles 3-2 and 3-3 in which the value of the angle Z is 30°, the deviation is relatively large. In view of this, the angle Z may be set to around 10°. For example, the angle Z may be set to 5° to 20° as described above.

(Evaluation Test 9)

In evaluation test 9, an EBR process was performed on the concavo-convex wafer W having a warp amount of 428 μm by using the nozzles 3-1, 3-2 or 3-3 used in evaluation test 8. The EBR cutting widths at respective positions in the circumferential direction of the wafer W were measured, and the maximum value minus the minimum value was calculated as the variation of the cutting width. Even in evaluation test 9, the set value of the cutting width was set to 1 mm.

Figure 22:
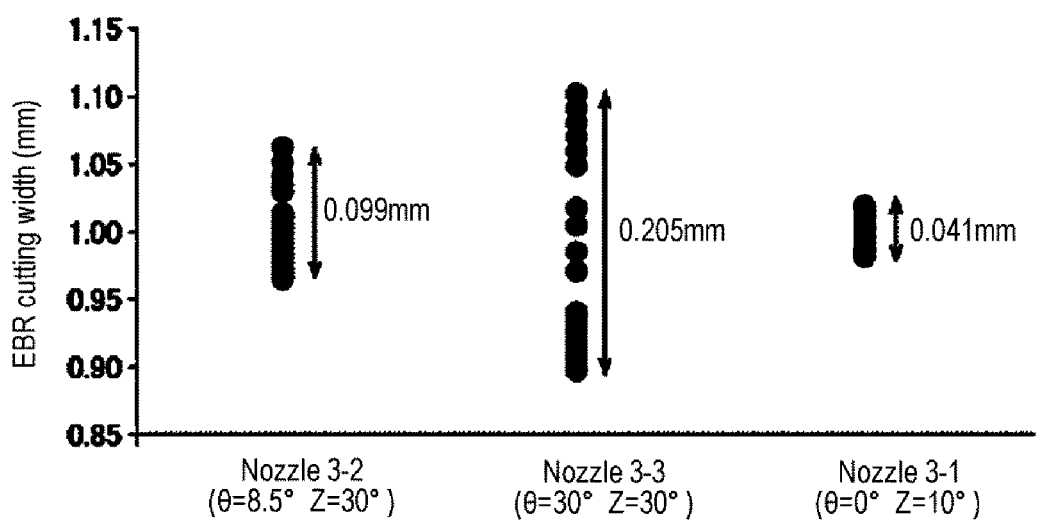
FIG. 22 is a characteristic diagram showing the results of an evaluation test.

The graph of FIG. 22 plots the results of evaluation test 9. The vertical axis of the graph indicates the cutting width (unit: mm). The variation (maximum value−minimum value) of the cutting width is 0.041 mm in the case of using the nozzle 3-1, 0.099 mm in the case of using the nozzle 3-2, and 0.205 mm in the case of using the nozzle 3-3. In the case of using the nozzle 3-1 as described above, the variation of the cutting width was suppressed to the smallest value. Accordingly, it was confirmed from evaluation tests 8 and 9 that the accuracy of the cutting width can be increased by using the nozzle 3-1 when processing any one of the concave wafer W, the convex wafer W and the concavo-convex wafer W.

(Evaluation Test 10)

Figure 23:
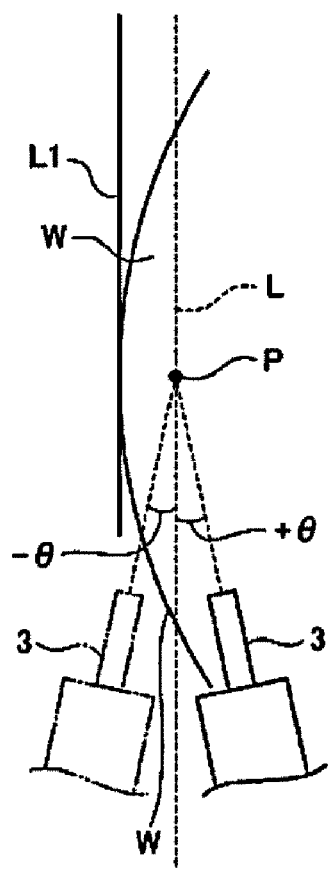
FIG. 23 is a plan view of the wafer and the removal liquid nozzle

In evaluation test 10-1, for a plurality of concave wafers W having a warp amount of 150 μm, an EBR process was performed by changing the angle θ of the removal liquid nozzle 3. The variation of the cutting width was measured. In evaluation test 10-2, for a plurality of convex wafers W having a warp amount of 250 μm, an EBR process was performed by changing the angle θ of the removal liquid nozzle 3. The variation of the cutting width was measured. In evaluation tests 10-1 and 10-2, the tests were conducted by disposing the removal liquid nozzle 3 as indicated by solid lines in FIGS. 3 and 23 and setting the angle θ so as to discharge the removal liquid outwardly from the inner side of the wafer W in a plan view, and by disposing the removal liquid nozzle 3 as indicated by one-dot chain lines in FIG. 23 and setting the angle θ so as to discharge the removal liquid inwardly from the outer side of the wafer W. In evaluation test 10, when the angle θ is set so that the discharge direction of the removal liquid is oriented outward from the inner side of the wafer W, a positive sign (+) is given to the numerical value of the angle θ. When the angle θ is set so that the discharge direction of the removal liquid is oriented inward from the outer side of the wafer W, a negative sign (−) is given to the numerical value of the angle θ. In FIG. 23, a tangent line of the wafer W is indicated by L1, and a line passing through the supply position P (the landing position of the liquid discharged from the removal liquid nozzle 3 on the wafer W) and extending parallel to the tangent line L1 is indicated by L.

Figure 24:
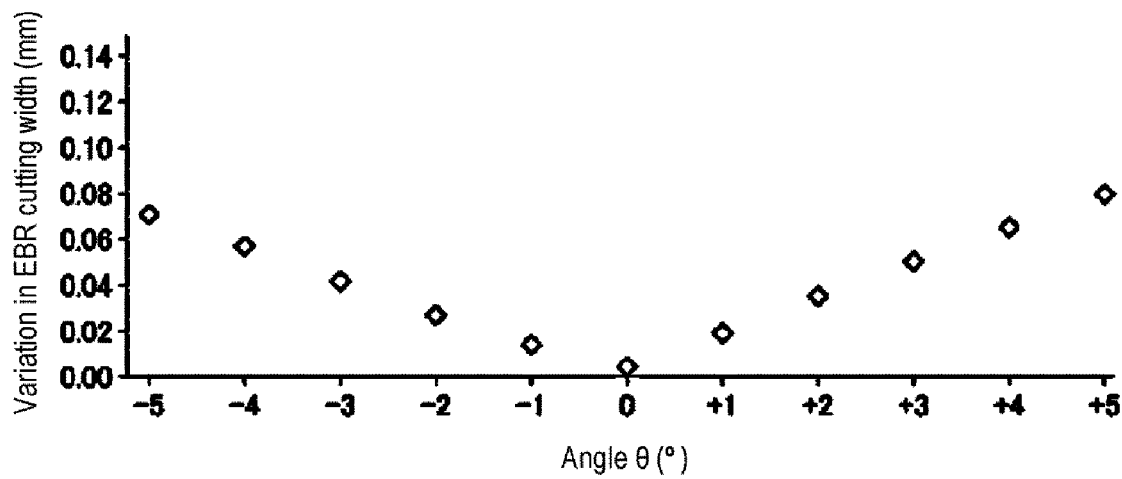
FIG. 24 is a characteristic diagram showing the results of an evaluation test.
Figure 25:
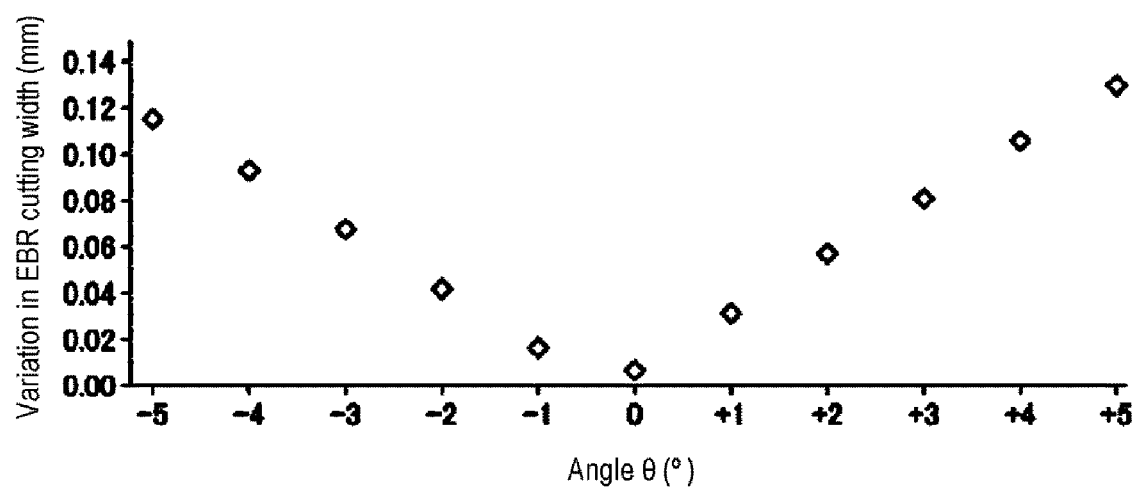
FIG. 25 is a characteristic diagram showing the results of an evaluation test.

Graphs of FIGS. 24 and 25 show the results of evaluation tests 10-1 and 10-2, respectively. The vertical axis of each graph indicates the variation (unit: mm) in the cutting width, and the horizontal axis of each graph indicates the angle θ. As shown in the graphs, as the absolute value of the angle θ increases, the variation of the cutting width increases. In practice, it is particularly preferable to suppress the variation in the cutting width to 0.1 mm or less. In both evaluation tests 10-1 and 10-2, when the angle θ ranges from −3° to +3°, the variation in the cutting width is 0.1 mm. Accordingly, it was confirmed that in the range in which the warp amount of the wafer W is +150 μm to −250 μm, the variation in the cutting width can be suppressed by setting the angle θ so as to fall within such a range. In the case where the angle θ is negative, there is a concern that the removal liquid moves to the center side of the wafer W from the supply position P and the cutting width deviates from a desired value. Therefore, the angle θ may be 0° or more. For this reason, the angle θ may be 0° to +3°.

According to the present disclosure, when a peripheral portion of a coated film formed on a surface of a substrate is removed by a removal liquid, the removal liquid is discharged from a removal liquid nozzle to the peripheral portion of the surface of the substrate. When discharging the removal liquid, the substrate is rotated at a rotation speed of 2,300 rpm or more. By rotating the substrate at a high rotation speed of 2,300 rpm or more, a large centrifugal force acts on a liquid flow of the removal liquid on the substrate surface, whereby the removal liquid is pressed outward on the substrate. As a result, it is possible to suppress the infiltration of the removal liquid to an end portion of the coated film and to suppress the occurrence of hump in the end portion of the coated film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coated film removing apparatus for removing, with a removal liquid, a peripheral portion of a coated film formed by supplying a coating liquid to a surface of a circular substrate, comprising:
   a spin chuck configured to hold the substrate and rotate together with the substrate;
   a removal liquid nozzle including a discharge port and configured to discharge the removal liquid on a peripheral portion of the surface of the substrate held by the spin chuck toward a predetermined direction from the discharge port so that the removal liquid discharged from the discharge port is oriented toward a downstream side in a rotational direction of the substrate; and
   a controller configured to output a control signal for executing:
   a first step of discharging the removal liquid from the removal liquid nozzle on the peripheral portion while moving a supply position of the removal liquid from a peripheral edge position of the surface of the substrate to a cutting position, which is between a center of the substrate and the peripheral edge position, in a state in which the substrate is rotated at a first rotation speed of 2,300 rpm or more by the spin chuck; and
   a second step of allowing the supply position to move away from the cutting position toward a peripheral edge of the substrate within 1 second after the supply position reaches the cutting position.

2. The apparatus of claim 1, wherein the controller is configured to output the control signal for executing:
   a step of, after the second step, setting the supply position to a position between the cutting position and the peripheral edge position or to the peripheral edge position, and discharging the removal liquid from the removal liquid nozzle while rotating the substrate at a second rotation speed lower than the first rotation speed.

3. The apparatus of claim 2, wherein the second rotation speed is set to 500 to 2,000 rpm.

4. The apparatus of claim 1, wherein the controller is configured to output the control signal for repeating the first step and the second step a multiple number of times.

5. The apparatus of claim 1, wherein the removal liquid nozzle is further configured such that the removal liquid is discharged toward the predetermined direction from the discharge port to the supply position of the removal liquid on the peripheral portion of the surface of the substrate, and an angle formed by the predetermined direction and a tangent line of the substrate at the supply position when viewed in a plan view is 0 degrees or more and less than 5 degrees.

6. The apparatus of claim 1, wherein an angle formed by a straight line connecting the removal liquid nozzle and the supply position of the removal liquid on the surface of the substrate and the surface of the substrate when viewed in a vertical plane is set to 20 degrees or less.

7. The apparatus of claim 1, wherein a diameter of the discharge port is set to 0.15 to 0.25 mm.

8. The apparatus of claim 1, wherein a discharge flow rate of the removal liquid when the supply position of the removal liquid on the surface of the substrate moves from the peripheral portion to the cutting position is set to 55 ml/min or more.

* * * * *